United States Patent
Zhao et al.

(10) Patent No.: US 10,665,634 B2
(45) Date of Patent: May 26, 2020

(54) DISTRIBUTED NANOWIRE SENSOR FOR SINGLE PHOTON IMAGING

(71) Applicant: Massachusetts Institute of Technology, Cambridge, MA (US)

(72) Inventors: Qingyuan Zhao, Malden, MA (US); Karl K. Berggren, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 798 days.

(21) Appl. No.: 15/423,446

(22) Filed: Feb. 2, 2017

(65) Prior Publication Data
US 2018/0145110 A1    May 24, 2018

Related U.S. Application Data

(60) Provisional application No. 62/289,998, filed on Feb. 2, 2016.

(51) Int. Cl.
| | |
|---|---|
| *H01L 27/18* | (2006.01) |
| *G01J 1/44* | (2006.01) |
| *G01J 3/02* | (2006.01) |
| *G01J 1/42* | (2006.01) |
| *G01J 5/02* | (2006.01) |
| *H01L 39/10* | (2006.01) |
| *H01L 39/12* | (2006.01) |
| *H01L 39/16* | (2006.01) |
| *G01J 5/06* | (2006.01) |
| *G01J 3/28* | (2006.01) |

(Continued)

(52) U.S. Cl.
CPC .............. *H01L 27/18* (2013.01); *G01J 1/42* (2013.01); *G01J 1/44* (2013.01); *G01J 3/0286* (2013.01); *G01J 3/2803* (2013.01); *G01J 5/023* (2013.01); *G01J 5/061* (2013.01); *G01J 5/20* (2013.01); *H01L 23/66* (2013.01); *H01L 39/10* (2013.01); *H01L 39/125* (2013.01); *H01L 39/16* (2013.01); *H01L 39/2416* (2013.01); *H04N 5/378* (2013.01); *G01J 2001/442* (2013.01); *G01J 2001/4446* (2013.01); *H01L 2223/6627* (2013.01); *H01L 2223/6672* (2013.01)

(58) Field of Classification Search
CPC .................................................... H01L 27/18
See application file for complete search history.

(56) References Cited

U.S. PATENT DOCUMENTS

| | | |
|---|---|---|
| 2,962,681 A | 11/1960 | Lentz |
| 3,283,282 A | 11/1966 | Rosenberg et al. |

(Continued)

OTHER PUBLICATIONS

Li et al., "Nonideal optical cavity structure of superconducting nanowire single photon detector," IEEE Journal of Selected Topics in Quantum Electronics (vol. 20, Issue 6, Nov.-Dec. 2014). (Year: 2014).*

(Continued)

*Primary Examiner* — Yara B Green
(74) *Attorney, Agent, or Firm* — Wolf, Greenfield & Sacks, P.C.

(57) ABSTRACT

An integrated, superconducting imaging sensor may be formed from a single, meandering nanowire. The sensor is capable of single-photon (or single-event) detection and imaging with ~10 micron spatial resolution and sub-100-picosecond temporal resolution. The sensor may be readily scaled to large areas.

27 Claims, 10 Drawing Sheets

(51) Int. Cl.
  *G01J 5/20* (2006.01)
  *H01L 23/66* (2006.01)
  *H01L 39/24* (2006.01)
  *H04N 5/378* (2011.01)

(56) References Cited

U.S. PATENT DOCUMENTS

| | | | |
|---|---|---|---|
| 4,028,714 | A | 6/1977 | Henkels |
| 5,332,722 | A | 7/1994 | Fujihira |
| 5,345,114 | A | 9/1994 | Ma et al. |
| 5,532,485 | A | 7/1996 | Bluzer et al. |
| 6,501,972 | B1* | 12/2002 | Carlsson ............... H01P 7/082 333/219 |
| 6,728,131 | B2 | 4/2004 | Ustinov |
| 6,919,579 | B2 | 7/2005 | Amin et al. |
| 6,979,836 | B2 | 12/2005 | Zagoskin et al. |
| 9,490,112 | B2 | 11/2016 | McDermott, III et al. |
| 2004/0016883 | A1 | 1/2004 | Polonsky et al. |
| 2005/0051726 | A1 | 3/2005 | Sobolewski et al. |
| 2008/0067500 | A1 | 3/2008 | Matsui et al. |
| 2013/0150245 | A1 | 6/2013 | Smith |
| 2016/0260596 | A1* | 9/2016 | McDermott, III .... H01J 49/025 |
| 2017/0160474 | A1* | 6/2017 | Mahmoodian ......... B82Y 20/00 |
| 2018/0090661 | A1 | 3/2018 | McCaughan et al. |

OTHER PUBLICATIONS

PCT/US2017/016270, Apr. 14, 2017, Invitation to Pay Additional Fees.
PCT/US2017/016270, Jun. 12, 2017, International Search Report and Written Opinion.
Invitation to Pay Additional Fees dated Apr. 14, 2017 for Application No. PCT/US2017/016270.
International Search Report and Written Opinion dated Jun. 12, 2017 for Application No. PCT/US2017/016270.
Bockstiegel et al., Development of a broadband NbTiN traveling wave parametric amplifier for MKID readout. J Low Temp Phys. 2014;176(3):476-82. Epub Jan. 14, 2014.
Zhao et al., Single-photon imager based on microwave plasmonic superconducting nanowire. Nature Photon. Jul. 29, 2016. 28 pages. Retrieved from the internet: ,https://arxiv.org/ftp/arxiv/papers/1605/1605.08693.pdf>. [retrieved May 26, 2017].
Zhao et al., Single-photon imager based on a superconducting nanowire delay line. Nat Photon. Apr. 2017;11:247-52. Epub Mar. 27, 2007.
U.S. Appl. No. 15/563,158, filed Sep. 29, 2017, McCaughan et al.
PCT/US2016/025710, Sep. 27, 2016, International Search Report and Written Opinion.
PCT/US2016/025710, Oct. 12, 2017, International Preliminary Report on Patentability.
International Search Report and Written Opinion dated Sep. 27, 2016 for Application No. PCT/US2016/025710.
International Preliminary Report on Patentability dated Oct. 12, 2017 for Application No. PCT/US2016/025710.
Allman et al., A near-infrared 64-pixel superconducting nanowire single photon detector array with integrated multiplexed readout. Appl Phys Lett. 2015;106:192601(1-4). Epub May 14, 2015.
Annunziata et al., Tunable superconducting nanoinductors. Nanotechnol. Oct. 2010;21(44):445202(1-6). Epub Oct. 5, 2010.
Calandri et al., Superconducting nanowire detector jitters limited by detector geometry. Appl Phys Lett. 2016;109:152601(1-4) Epub Oct. 12, 2016.
Clem et al., Kinetic impedance and depairing in thin and narrow superconducting films. Phys Rev B. Jul. 2012;86(17):174521(1-16). Epub Nov. 30, 2012.
Dauler et al., Photon-number-resolution with sub-30-ps timing using multi-element superconducting nanowire single photon detectors. J Mod Optics. Jan.-Feb. 2009;56(2-3):364-73.
Doerner et al., Operation of superconducting nanowire single-photon detectors embedded in lumped-element resonant circuits. IEEE Trans Appl Supercond. Apr. 2016;26(3):220205(1-5). Epub Feb. 5, 2016.
Gao et al., A titanium-nitride near-infrared kinetic inductance photon-counting detector and its anomalous electrodynamics. Appl Phys Lett. 2012;101:142602(1-4). Epub Oct. 5, 2012.
Gaudio et al., Inhomogeneous critical current in nanowire superconducting single-photon detectors. Appl. Phys. Lett. 2014;105:222602(1-4).
Gol'tsman et al., Picosecond superconducting single-photon optical detector. Appl Phys Lett. Aug. 6, 2001. 79(6):705-7. Epub Aug. 2001.
Hadfield, Single-photon detectors for optical quantum information applications. Nat Photon. Dec. 2009;3(12):696-705. Epub Nov. 30, 2009.
Hofherr et al., Time-tagged multiplexing of serially biased superconducting nanowire single-photon detectors. IEEE Trans Appl Supercond. Jun. 2013;23(3):2510205(1-5).
Hofherr et al., Orthogonal sequencing multiplexer for superconducting nanowire single-photon detectors with RSFQ electronics readout circuit. Opt Express. Dec. 17, 2012;20(27):28683-97.
Jagutzki et al., A broad-application microchannel-plate detector system for advanced particle or photon detection tasks: large area imaging, precise multi-hit timing information and high detection rate. Nucl Instruments Methods Phys Res Sect A. 2002;477(1-3):244-9.
Kerman et al., Readout of superconducting nanowire single-photon detectors at high count rates. J Appl Phys. 2013;113:144511(1-6). Epub Apr. 11, 2013.
Klopfenstein, A transmission line taper of improved design. Proc IRE. 1956;44:31-5.
Lamas-Linares et al., Nanosecond-scale timing jitter for single photon detection in transition edge sensors. Appl Phys Lett. Jun. 2013;102(23):231117(1-4). Epub Jun. 11, 2013.
Majedi, Theoretical investigations on THz and optical superconductive surface plasmon interface. IEEE Trans Appl Supercond. Jun. 2009;19(3):907-10.
Marsili et al., Efficient single photon detection from 500 nm to 5 μm wavelength. Nano Lett. Aug. 2012;12(9):4799-804. Epub Aug. 13, 2012.
Marsili et al., Detecting single infrared photons with 93% system efficiency. Nat Photon. Mar. 2013;7:210-4. Epub Feb. 24, 2013.
Miki et al., A 64-pixel NbTiN superconducting nanowire single-photon detector array for spatially resolved photon detection. Opt Express. Apr. 7, 2014;22(7):7811-20. doi: 10.1364/OE.22.007811. Epub Mar. 27, 2014.
Mirhosseini et al., High-dimensional quantum cryptography with twisted light. New J Phys. Mar. 2015;17:033033(1-12).
Najafi et al., Fabrication process yielding saturated nanowire single-photon detectors with 24-ps jitter. IEEE J Sel Top Quantum Electron. Mar./Apr. 2015;21(2):3800507(1-7).
Pond et al., Kinetic inductance microstrip delay lines. IEEE Trans Magnet. Mar. 1987;23(2):903-6.
Rosenberg et al., High-speed and high-efficiency superconducting nanowire single photon detector array. Opt Express. Jan. 2013;21(2):1440-7. Epub Jan. 14, 2013.
Santavicca et al., Microwave dynamics of high aspect ratio superconducting nanowires studied using self-resonance. J Appl Phys. Jun. 2016;119(23):234302(1-8).
Suttle et al., A superconducting ion detection scheme for atom probe tomography. Mar. 2016 Meeting of the American Physical Society (APS). 2 page Abstract, Abs. id. Y7.003. Biblio Code: 2016APS.MAR..Y7003S. http://adsabs.harvard.edu/abs/2016APS..MAR.Y7003S.
Tsiatmas et al., Low-loss terahertz superconducting plasmonics. New J Phys. Nov. 2012;14:115006(1-10).
Walborn et al., Quantum key distribution with higher-order alphabets using spatially-encoded qudits. Phys Rev Lett. Mar. 8, 2006;96:090501(1-4).
Yang et al., Modeling the electrical and thermal response of superconducting nanowire single-photon detectors. IEEE Trans Appl Supercond. Jun. 2007;17(2):581-5.

(56) References Cited

OTHER PUBLICATIONS

Yang et al., Fabrication development for nanowire GHz-counting-rate single-photon detectors. IEEE Trans Appl Supercond. Jun. 2005;15(2):626-30.

Yang et al., Superconducting nanowire single photon detector with on-chip bandpass filter. Opt Express. Jun. 2014;22(13):16267-72. doi: 10.1364/OE.22.016267.

You et al., Jitter analysis of a superconducting nanowire single photon detector. AIP Advances. Aug. 2013;3(7):072135(1-6). Epub Jul. 30, 2013.

Zhang et al, Secure quantum key distribution using continuous variables of single photons. Phys Rev Lett. Mar. 2008;100:110504(1-4).

Zhao et al., Superconducting-nanowire single-photon-detector linear array. Appl Phys Lett. 2013;103:142602(1-4). Epub Sep. 30, 2013.

Zhao et al., Counting rate enhancements in superconducting nanowire single-photon detectors with improved readout circuits. Opt Lett. Apr. 1, 2014;39(7):1869-72.

\* cited by examiner

DISTRIBUTED NANOWIRE SENSOR FOR SINGLE PHOTON IMAGING

CROSS REFERENCE TO RELATED APPLICATIONS

This application claims priority to U.S. Provisional Application No. 62/289,998 titled "Distributed Nanowire Sensor for Single Photon Imaging" filed Feb. 2, 2016, which application is incorporated herein by reference in its entirety.

STATEMENT OF GOVERNMENT SUPPORT

This invention was made with Government support under Grant No. ECCS-1509486 awarded by the National Science Foundation. The Government has certain rights in the invention.

FIELD

The technology relates to integrated, superconducting, highly-sensitive imaging devices.

BACKGROUND

Single-photon detection is a useful technique in the fields of spectroscopy, biological imaging, astrophysics, and quantum-information processing. Single-photon detection may also be useful for communication systems in which received signal levels are very low. The technique can allow detection of trace elements or molecules, biological processes or specimen organization, distant stars, quantum computational results, and weak signals that would not be detected with conventional semiconductor photodetectors.

Although different types of single-photon detectors have been developed, most have limitations when applied to imaging applications. For example, photomultiplier tubes and avalanche photodiodes have been used very successfully as individual detectors for single-photon detection in the visible region of the optical spectrum. However, their response to photons in the infrared region (wavelengths longer than about 900 nanometers) deteriorates appreciably compared to the visible region. Additionally, photomultiplier tubes are expensive and not suitable for incorporating into compact imaging arrays having sub-millimeter pixel sizes. Although avalanche photodiodes are more suited for incorporating into compact imaging arrays, their quantum efficiency is limited to about 85% over a narrow portion of the visible spectrum and drops to about 50% at 400 nanometers (400 nm) and 900 nm. It is also difficult to incorporate avalanche photodiodes, configured for single-photon detection, in imaging arrays and achieve low dark-count rates (less than 500 counts per second).

Other recently-developed single-photon detectors include the transition edge sensor (TES) and microwave kinetic inductance detector (MKID), however these devices have temporal resolutions over several nanoseconds (ns) and microseconds (µs), respectively. Recently, superconducting-nanowire single-photon detectors (SNSPDs) have been operated in a linear array, but it was found that the array size would be limited to tens of detector elements. Their pixel-number limitation and long delay lines between the SNSPDs make these devices unsuitable for large-area two-dimensional arrays of pixels having a high fill factor.

SUMMARY

An imaging device having single-photon sensitivity is described. The imaging device may comprise a single, superconducting nanowire sensor that meanders across an area of a substrate to form a two-dimensional detection region with an effective number of pixels in the hundreds or higher. According to some embodiments, the nanowire sensor senses detection events (e.g., single-photon or single-particle interactions with the nanowire sensor) and produces two signals for each detection event that are transmitted along the nanowire in opposite directions. The two signals indicate the time and location of each detection event along the nanowire, and may be processed to generate spatial and time-resolved images of the detection events. The nanowire sensor, in addition to serving as a single-photon or single particle detector, serves as a slow-wave transmission line that improves the spatial-resolving and temporal-resolving properties of the nanowire sensor.

The imaging resolution of an imaging device incorporating a nanowire sensor may be on the order of approximately 10 microns or less. The temporal resolution may be as low as approximately 50 picoseconds (50 ps) or less, and the imaging device may sense single detection events at rates as high as one million per second. The nanowire sensor is scalable to large, two-dimensional detection regions for far-field imaging applications, and is also scalable to micron-scale detection regions for near-field imaging applications. Because of its spatial and temporal imaging capabilities, an imaging device incorporating a nanowire sensor may be used to enhance the information-carrying capacity of a quantum channel, for example, and used to improve security in quantum key distribution, applications in which information is typically encoded in the position and arrival time of individual photons.

Some embodiments relate to an imaging device comprising a substrate, an image-detection region located on the substrate, and a conductive line patterned in the image-detection region and formed from a superconducting material, wherein the conductive line is configured to provide a first signal from a first end of the conductive line and a second signal from a second end of the conductive line in response to sensing a detection event, and wherein the first signal and second signal indicate a location of the detection event along the conductive line.

Some embodiments relate to a method of electronic imaging comprising acts of operating a conductive line in a superconducting state; receiving a first signal from a first end of the conductive line in response to formation of a localized region of normal conductivity in the conductive line; receiving a second signal from a second end of the conductive line in response to the formation of the localized region of normal conductivity in the conductive line; determining a difference in time associated with the first signal and the second signal; and computing, based on the difference in time, a location along the conductive line at which the localized region of normal conductivity formed.

Some embodiments relate to an imaging system comprising an imaging chip having a substrate, an image-detection region located on the substrate, and a conductive line patterned in the image-detection region and formed from a superconducting material. The conductive line may be configured to provide a first signal from a first end of the conductive line and a second signal from a second end of the conductive line in response to sensing a detection event, wherein the first signal and second signal indicate a location of the detection event along the conductive line. The imaging system may further include a first amplifier arranged to receive the first signal from the first end of the conductive line, and a second amplifier arranged to receive the second signal from the second end of the conductive line. In some aspects, the imaging system may also include a signal analyzer arranged to receive an amplified first signal from the first amplifier and an amplified second signal from the second amplifier and be configured to process the first amplified signal and the second signal amplified signal to determine a spatial location of the detection event as well as a time of occurrence of the detection event.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

The features and advantages of the present invention will become more apparent from the detailed description set forth below when taken in conjunction with the drawings.

DETAILED DESCRIPTION

Detecting spatial and temporal information of individual photons or energetic particles is useful for applications in spectroscopy, biology, astrophysics, quantum-information processing, and some communication systems. The inventors have noted some of the limitations of conventional single-photon detectors, and have conceived of a superconducting, nanowire sensor that is suitable for single-photon detection in two-dimensional or three-dimensional imaging applications with high temporal resolution. The nanowire sensor can sense photons over a broad range of wavelengths (from deep ultraviolet into the infrared) and can sense other energetic entities such as energetic particles (energetic ions and molecules), plasmons and phonons. According to some embodiments, a nanowire sensor may comprise a single conductive line that is formed from a single layer of superconducting material and patterned to meander across a detection region on a substrate. The nanowire sensor may be formed at low cost and scaled to large detection regions for far-field imaging applications, or may be scaled to micron-scale detection regions for near-field imaging applications.

Figure 1:
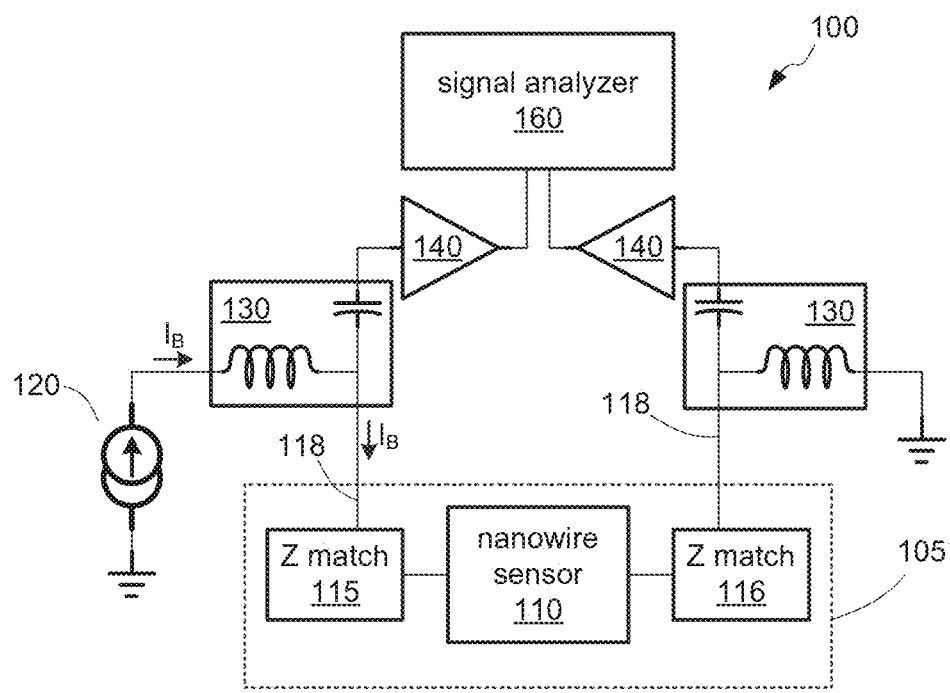
FIG. 1 depicts an imaging system that includes a nanowire imaging sensor, according to some embodiments.

In overview and referring to FIG. 1, a nanowire imaging system 100 according to some embodiments may comprise a substrate (not shown in the drawing) on which is formed a nanowire sensor 110. The nanowire sensor 110 (which may be referred to as a superconducting nanowire single-photon imager (SNSPI) in some applications) may connect to two impedance-transforming elements 115, 116 and to two bias Ts 130. The bias Ts 130 may include inductive and capacitive elements and be arranged to apply a bias current h from a source 120 to the nanowire sensor 110 and couple signals received from the nanowire sensor 110 to one or more amplifiers 140. In some implementations, the bias current h is a DC current, although the current may be modulated in some cases. Outputs from the one or more amplifiers 140 may be provided to a signal analyzer 160, which may be configured to process signals from the nanowire sensor 110 and generate image data representative of at least the location of detection events sensed by the nanowire sensor. In some embodiments, the signal analyzer 160 may be further configured to generate one or more images additionally, or alternatively, that represent timing of detection events and/or number of detection events occurring simultaneously.

In some embodiments, there may be additional or alternative amplifiers (not shown in FIG. 1) and/or signal filters (not shown in FIG. 1) located between the impedance-transforming elements 115, 116 and bias Ts 130. When in operation, the nanowire sensor 110 may be in a thermally-cooled environment (indicated by the dotted line 105) such that a conductive line of the nanowire sensor becomes superconducting. The thermally-cooled environment may comprise an environment chilled by liquid helium, for example. Radio-frequency cabling 118 may connect the impedance-transforming elements to their respective bias Ts in the imaging system 100. In some cases, impedance-transforming elements may be located in the thermally-cooled environment 105. In some embodiments, circuit components (impedance-transforming element, bias T, amplifier(s), transmission cables) connected to one side of the nanowire sensor may be of essentially the same design as their corresponding components connected to the other side of the nanowire sensor. In other embodiments, one or more of the circuit components may differ between the two sides of the nanowire sensor.

Figure 2:
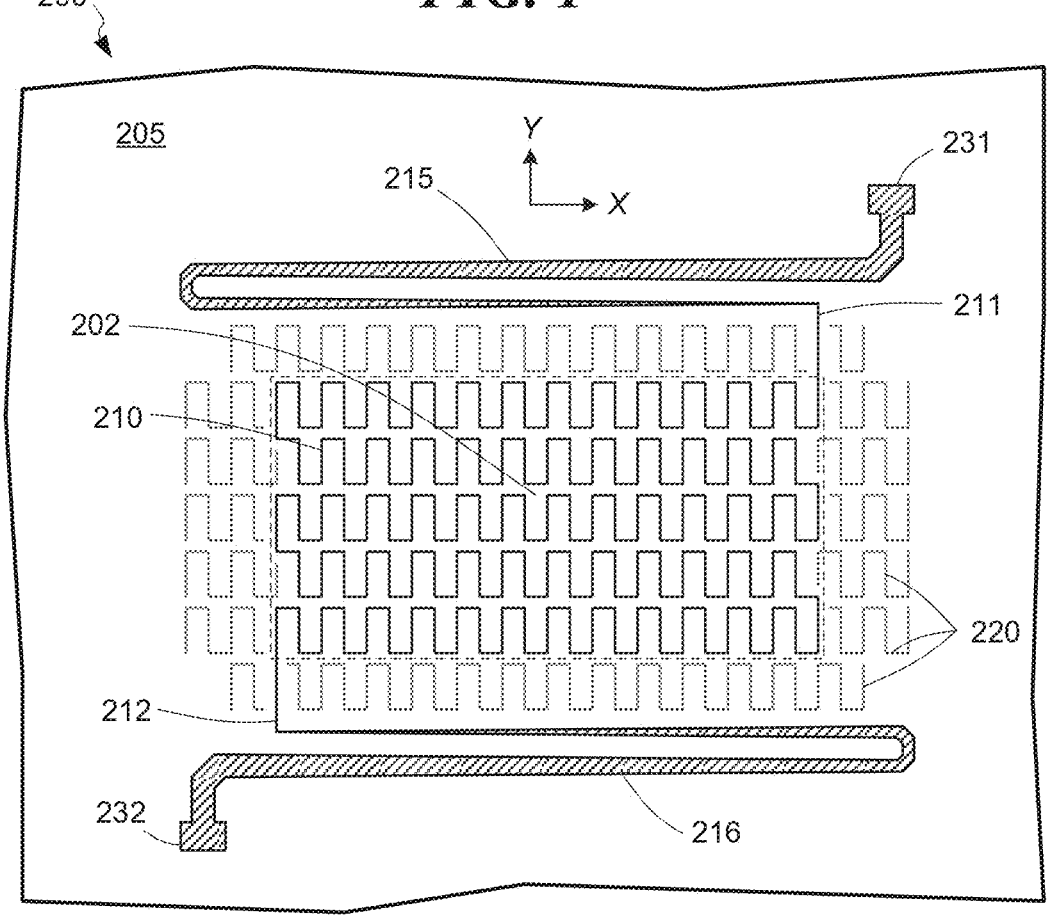
FIG. 2 depicts a nanowire imaging sensor, according to some embodiments.

Further details of a nanowire sensor 110 are shown in FIG. 2. According to some embodiments, an imaging chip 200 may comprise a nanowire sensor 210 formed on a substrate 205. The nanowire sensor 210 may comprise a continuous conductive line (indicated by the black continuous line) formed of a superconducting material that meanders across a detection region 202 (indicated by the dashed rectangle). The nanowire sensor 210 may have a first end 211 and a second end 212 that connect to a first impedance-transforming element 215 and a second impedance matching element 216, respectively.

The nanowire sensor 210 may be formed from any suitable superconducting material. One example of a superconducting material is niobium nitrate (NbN), although other superconducting materials may be used. Other superconducting materials include, but are not limited to YBaCuO, HgTlBaCaCuO, MgB2, BISCCO, Nb, NbTiN, NbCN, Al, AlN, WSi, Ga, In, Sn, Pb, or MoGe. Some embodiments may include combinations (e.g., multi-layer depositions) of two or more of these superconducting materials. In some implementations, a nanowire sensor may include one or more adjacent layers of non-superconducting material.

A nanowire sensor 210 may meander in any suitable pattern across the detection region 202. The meander pattern may include a double-meander pattern, as shown in FIG. 2, a single-meander pattern, or a higher-order meander pattern. The meander pattern may comprise repeated patterns (e.g., spatial square-wave periods) linked together in rows that are interconnected as shown in FIG. 2, according to some embodiments. The repeated patterns may be distributed at regular intervals across the detection region 202. In some implementations, a single-meander pattern may comprise straight lines running across the detection region 202 and connected to form a boustrophedonic pattern.

According to some embodiments, a first impedance-transforming element 215 and a second impedance-transforming element 216 may be formed as a tapered conductor from a same material as the nanowire sensor, although in other embodiments the impedance-transforming elements may be formed from a different material, such as aluminum, gold, or any other suitable superconducting or non-superconducting material. In some cases, the first and second impedance-transforming elements 215, 216 may be formed as Klopfenstein tapered transmission lines. For example, the first impedance-transforming element 215 may connect to the first end 211 of the nanowire sensor 210 having a same linewidth as the conductive line of the nanowire sensor 210. The width of the first impedance-transforming element 215 may increase gradually to a larger width until it connects with a first contact pad 231. Similarly, the second impedance-transforming element 216 may, in a same manner, increase in width from a second end 212 of the nanowire sensor 210 to a larger width at a second contact pad 232. According to some implementations, the width of the first and second impedance-transforming elements at the first and second contact pads may be selected such that the first and second impedance-transforming elements have an impedance at the first and second contact pads that is approximately equal to an impedance of signal lines connecting the contact pads to the bias Ts 130 or signal amplifiers.

Other types of impedance-transforming elements may also be used. For example, one or both of the impedance-transforming elements 115, 116 (referring again to FIG. 1) may be formed as lumped-element radio-frequency networks of integrated or discrete inductive and capacitive elements. For example, an impedance-transforming element may include one or more spiral inductors and one or more metal-insulator-metal or metal-insulator-semiconductor capacitors connected together.

According to some embodiments, the impedance-transforming elements 115, 116 may additionally provide high-pass filtering and suppress DC and low-frequency signals (e.g., below about 500 MHz) from the nanowire sensor. In other embodiments, separate high-pass filters may be connected between the bias Ts and the nanowire sensor 110. The inventors have found that high-pass filtering helps restore the nanowire sensor to a stable superconducting state between detection events.

In some cases, there may not be impedance-transforming elements 115, 116 connected to ends of the nanowire sensor 110. Instead, outputs from the nanowire sensor may be carried over signal lines having a same impedance as the nanowire sensor or otherwise provided to an amplifier (not shown in FIG. 1) having a same input impedance as the nanowire sensor. In yet other cases, there may be impedance mismatches between the nanowire sensor and signal analyzer and inefficient signal coupling and reflections may be tolerated, though these may reduce the performance of an imaging system.

According to some embodiments, impedance-transforming elements 115, 116 may be formed immediately adjacent to ends of the nanowire sensor 110. In some cases, the impedance-transforming elements, or some components thereof, may be formed at a same time as the nanowire sensor during fabrication using a same process and same material. In other cases, the nanowire sensor and impedance-transforming elements may be formed at different times during a fabrication process.

According to some embodiments and referring again to FIG. 2, feature sizes associated with the nanowire sensor 210 may be less than about 200 nm. Accordingly, there may be dose-biasing features 220 located adjacent to the detection region 202. The dose-biasing features may be similar to patterns of the nanowire sensor 210, in some cases. However, other dose-biasing feature shapes may be used in some embodiments. The dose-biasing features may not connect to the nanowire sensor 210, but instead be used to achieve uniform patterning of the nanowire sensor 210. For example, without the dose-biasing features the linewidth of the nanowire sensor 210 may change near the periphery of the detection region 202 compared to the center of the detection region, because a patterning dose during lithography at the periphery of the detection region may be less than a patterning dose at the center of the detection region. By including the dose-biasing features, the exposure dose for the nanowire sensor 210 may be made more uniform throughout the detection region 202 and yield a more uniform nanowire sensor 210 (e.g., uniformity in width of a conductive line and other features of a nanowire sensor over the entire length of the nanowire sensor).

In some embodiments, a pattern of the nanowire sensor 210 may not be uniform over its length. For example, a width of a conductive line in a nanowire sensor or other feature size may vary gradually from a first end 211 of the nanowire sensor to a second end 212 of the nanowire sensor. In some cases, a width of a conductive line may be modulated along the length of the nanowire sensor.

Although a single nanowire sensor is shown in FIG. 2 having a single detection region 202, multiple nanowire sensors may be linearly arrayed, tiled in two dimensions, and stacked vertically to provide two-dimensional and three-dimensional imaging over larger areas and/or to improve detection efficiency in the detection region. According to some embodiments, the area of a single detection region may be between about 4 $\mu m^2$ and about 4 $mm^2$.

Figure 3A:
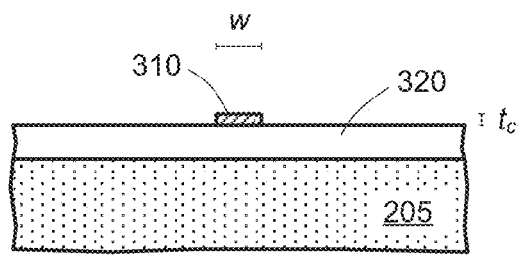
FIG. 3A depicts a cross-section view of a portion of nanowire sensor, according to some embodiments.

A further detailed view of a nanowire sensor 210 is shown in FIG. 3A, according to some embodiments. A nanowire sensor may comprise a conductive line 310 formed from a superconducting material that is located on an electrically insulating layer 320. The width w of the conductive line 310 may be between 20 nm and 750 nm, according to some embodiments. A thickness $t_c$ of the conductive line may be between 2 nm and 20 nm, according to some embodiments. The insulating layer 320 may comprise an oxide, a nitride, or any other suitable electrically insulating material that may be formed on a substrate 205. A thickness of the insulating layer may be between 50 nm and 1 $\mu m$. In some cases, there may be an additional insulating layer (not shown) formed over the conductive line 310 and insulating layer 320. The substrate 205 may comprise a semiconductor such as silicon, though other semiconductors may be used. In some cases, other substrate materials may be used and the insulating layer 320 may not be present. For example, the substrate 205 may comprise an electrically insulating and transparent substrate such as sapphire, fused silica, diamond, or quartz. In some cases the substrate may comprise a ceramic material. When two or more nanowire sensors are stacked vertically on a substrate, there may be additional insulating layers 320 between each level having a conductive line 310 of a nanowire sensor 210.

Figure 3C:
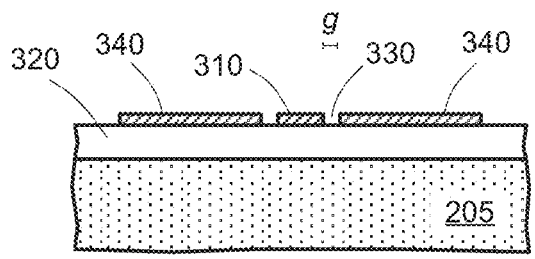
FIG. 3C depicts a cross-section view of a portion of a nanowire sensor, according to some embodiments.

In some cases, a nanowire sensor 210 may comprise a coplanar, superconducting transmission line, as depicted in FIG. 3C. The coplanar transmission line may comprise a conductive line 310 formed of a superconducting material and located between conductive reference planes 340. The reference planes 340 may also be formed of a same superconducting material as the conductive line 310, according to some embodiments, though the reference planes 340 may be formed of a different material in some cases. There may be patterned gaps 330 of width g between the conductive line 310 and the coplanar reference planes 340. The width of the gaps g may be between 20 nm and 200 nm, according to some embodiments. The reference planes 340 may be connected to a reference potential (e.g., ground or a fixed positive or negative voltage) during operation of the nanowire sensor.

Figure 3B:
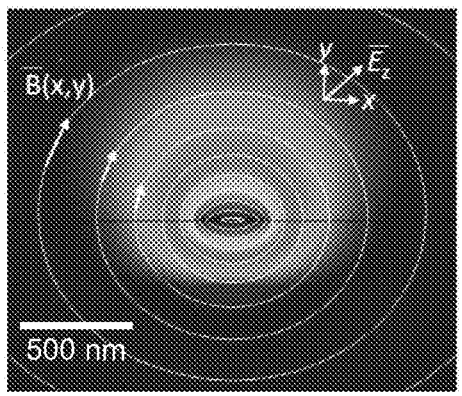
FIG. 3B illustrates a simulated electromagnetic field associated with a plasma wave travelling in the nanowire structure of FIG. 3A.
Figure 3D:
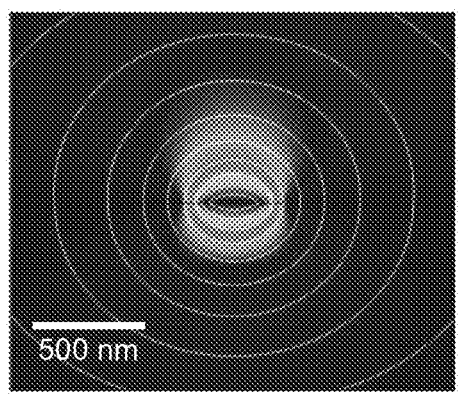
FIG. 3D illustrates a simulated electromagnetic field associated with a plasma wave travelling in the nanowire structure of FIG. 3C.
Figure 3E:
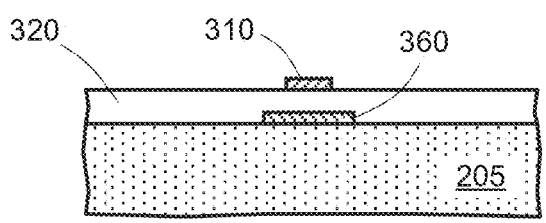
FIG. 3E depicts a cross-section of a portion of a nanowire sensor, according to some embodiments.

A further example of a nanowire sensor 210 is depicted in FIG. 3E. In some cases, an adjacent reference plane 360 may be formed on the substrate 205 in a separate level and spaced from the conductive line 310 by at least the insulating layer 320. The adjacent reference plane may be formed from a superconducting material or non-superconducting material, and may be connected to a reference potential during operation of the nanowire sensor 210. The structures shown in FIG. 3C and FIG. 3E may comprise integrated, microwave transmission lines.

The conductive line 310 and reference planes 340, 360 for any of the above nanowire sensor structures may be patterned using conventional microfabrication and nanofabrication techniques. In some embodiments, the conductive line 310 and reference planes 340, 360 may be patterned using a lift-off processing technique. For example, the nanowire sensor 210, dose-biasing features 220, and the impedance-transforming elements 215, 216 may be formed from a same superconducting material that is deposited in a thin film over a patterned resist on the substrate. For example, the patterned resist may be located where the gaps 330 are to be formed between the conductive line 310 and reference planes 340. During lift-off, the superconducting material over the resist is removed from the substrate, leaving the conductive line 310 and reference planes 340 adhered to the exposed insulating layer 320, for example. In other embodiments, the nanowire sensor and the impedance-transforming elements may be formed from different materials that are deposited at different times.

In some cases, etching processes may be used to pattern the nanowire sensor, dose-biasing features, and/or the impedance-transforming elements. For example, a layer of superconducting material may be deposited on the substrate and a resist patterned over the layer of superconducting material. The resist may serve as a mask for a subsequent dry-etching process (using a reactive-ion etcher, for example) that transfers the pattern in the resist into the layer of superconducting material and defines the conductive line 310, reference planes 340, 360, dose-biasing features 220, and/or impedance-transforming elements 215, 216.

Figure 4A:
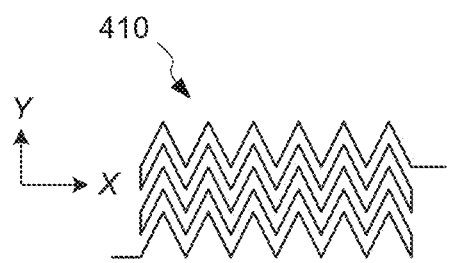
FIG. 4A depicts a meander pattern for a nanowire sensor, according to some embodiments.
Figure 4B:
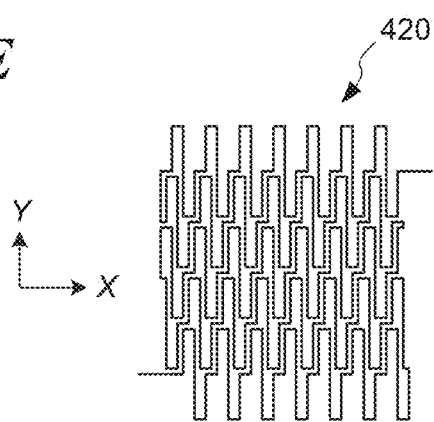
FIG. 4B depicts a meander pattern for a nanowire sensor, according to some embodiments.

As noted above in reference to FIG. 2, a nanowire sensor 210 may have any suitable pattern in the detection region 202. FIG. 4A depicts an alternative meander pattern that may be used in some embodiments. In some cases, a zig-zag meander pattern 410 may be used in which rows of the nanowire sensor are interleaved (e.g., enter into a common area). Such an interleaved pattern can increase the spatial resolution of the nanowire sensor over the structure shown in FIG. 2. For example, the spatial resolution in the Y direction for the pattern shown in FIG. 2 is less than the spatial resolution in the Y direction of a nanowire sensor having the pattern shown in FIG. 4A. An alternative to the zig-zag pattern 410 would be an interleaved sinusoidal pattern. FIG. 4B depicts a rectilinear interleaved pattern 420 that may be used in other embodiments to increase the spatial resolution in the Y direction. According to some embodiments, the spatial resolution in each direction may be optimized independently for a particular application (e.g., near-field imaging at sub-wavelength resolution) by reducing or increasing the spacing between adjacent sections of the nanowire for the X and Y directions as desired.

Figure 5A:
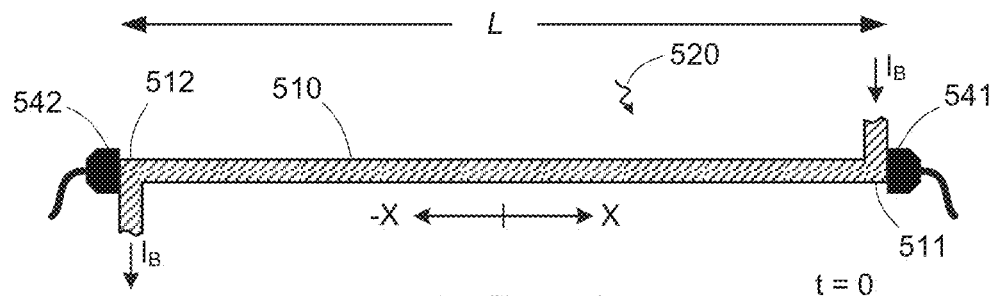
FIG. 5A depicts a portion of a nanowire sensor for explaining operation of a nanowire imaging sensor.

Operation of a nanowire sensor will now be described with reference to FIG. 5A, FIG. 5B, and FIG. 5C. To simplify the explanation, a short linear length of a nanowire sensor is considered. A conductive line 510 of the nanowire sensor extends a length L in the +X and −X directions. The conductive line 510 may have a first end 511 and a second end 512. A bias current $I_b$ may flow into the first end and out of the second end, as indicated in FIG. 5A. A first detector 541 may be coupled to the first end 511 and configured to detect an electromagnetic pulse received at the first end. A second detector 542 may be coupled to the second end 512 and also be configured to detect an electromagnetic pulse. At a time t=0, a photon 520 (or other energetic entity) may be traveling toward the conductive line 510. The conductive line at t=0 is in a superconducting state.

Figure 5B:
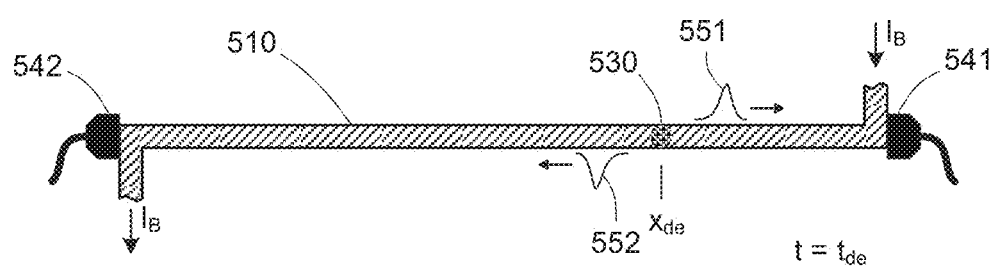
FIG. 5B depicts a detection event and hot spot formation in a portion of a nanowire sensor.

At time $t=t_{de}$ depicted in FIG. 5B, the photon 520 (or other energetic entity) may be absorbed in, or interact with, the superconducting line 510 creating a detection event. The detection event may be manifested as a hotspot 530 formed at a location $x_{de}$ along the conductive line at which the photon was absorbed. When the conductive line 510 is in a superconducting state, the line exhibits no resistant to the current $I_b$ flowing through the line. However, upon absorption of the photon 520 a small region of the conductive line transitions from a superconducting state to a normal conducting state creating the so-called hotspot 530. In this localized region, the conductive line 510 exhibits a finite resistance. Initially, the hotspot 530 may extend about 100 nm in length along the conductive line 510, depending on the amount of bias current $I_b$. In time, ohmic heating from the hotspot may cause a larger region (10 microns or more) of the conductive line to transition to a normal conducting state. Between detection events, the conductive line cools and returns to a superconducting state.

Formation of the hotspot 530 creates an electromagnetic disturbance on the conductive line 510 by suddenly presenting finite resistance to the bias current $I_b$. This disturbance may be manifested as a first electromagnetic pulse 551 that travels toward the first detector 541 and a second pulse 552 that travels toward the second detector 542. Depending upon where the detection event occurs $x_{de}$, the travel time of the first pulse 551 to the first detector 541 may be less than, equal to, or greater than the travel time of the second pulse 552 to its detector 542.

According to some embodiments, the pulses comprise microwave plasma waves that are guided by the superconducting nanowire sensor 210. Simulations of the electromagnetic fields associated with these plasma waves are shown in FIG. 3B and FIG. 3D for the corresponding structures depicted in FIG. 3A and FIG. 3C, respectively. For the simulations, the conductive line 310 was NbN having a thickness $t_c$ of approximately 7 nm and a width w of 300 nm. For the coplanar transmission line structure, the gap width g was 100 nm. The insulating layer was silicon dioxide and the substrate was silicon. For the simulations, the frequency of the microwave plasma wave was 5 GHz. By using a coplanar transmission line structure shown in FIG. 3C, the electromagnetic field is confined more tightly around the conductive line 310 as it propagates along the nanowire sensor.

Figure 5C:
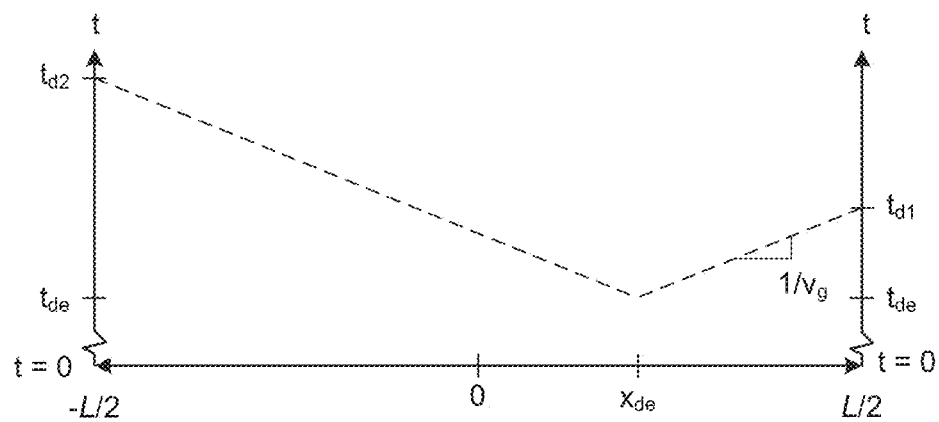
FIG. 5C illustrates pulse travel in the nanowire sensor and pulse arrival times $t_{d1}$, $t_{d2}$.

FIG. 5C graphically portrays a case in which the travel time for the first pulse 551 is less than the travel time for the second pulse 552. The vertical axes in FIG. 5C correspond to time and the horizontal axis corresponds to distance along the conductive line 510. Both pulses will travel at a same group velocity, provided the nanowire sensor is uniform along its length. The group velocity relates to the slope of the dashed lines in FIG. 5C and is determined by properties of the nanowire sensor. As illustrated, the first pulse 551 arrives at the first detector 541 with an arrival time $t_{d1}$ that is less than an arrival time $t_{d2}$ of the second pulse 552 at the second detector 542.

The location $x_{de}$ along the conductive line 510 at which the detection event occurred can be determined by taking the difference between the arrival times $t_{d1}$ and $t_{d2}$ of the first pulse 551 and the second pulse 552. For example, the location $x_{de}$ can be determined from the following expression $$x_{de} = \frac{(t_{d2} - t_{d1})v_g + L}{2} \qquad \text{Eq. (1)}$$

where $v_g$ is the group velocity for the nanowire sensor and L is the length of the nanowire sensor. In practice, signal propagation times between the ends of the nanowire sensor 110 and signal analyzer are accounted for and cancelled when analyzing the signals received from the nanowire sensor.

The time $t_{de}$ at which the detection event occurred can also be determined from the two signal arrival times $t_{d1}$ and $t_{d2}$. The time of the detection event can be determined by summing the arrival times of the first and second pulses, according to the following expression.

$$t_{de} = \frac{(t_{d2} + t_{d1}) - L/v_g}{2} \qquad \text{Eq. (2)}$$

Accordingly, a nanowire sensor 210 can be used to determine the position of a detection event along the nanowire, while preserving information about the time of arrival of the photon or energetic entity. In practice, time delays associated with impedance-transforming elements, cabling, filters, amplifier delays, etc. must be accounted for when determining pulse arrival times $t_{d1}$, $t_{d2}$ at ends of the nanowire sensor.

The group velocity $v_g$ of a nanowire sensor depends upon several factors that include choice of superconducting material, structure of the nanowire sensor, and feature sizes of the nanowire sensor. According to some embodiments and without being bound to a particular theory, the group velocity $v_g$ of the nanowire sensor 210 may be expressed as $$v_g = \sqrt{\frac{1}{(L_{km} + L_{gm})C_m}} \qquad \text{Eq. (3)}$$

where $L_{km}$ is the kinetic inductance per unit length of the nanowire, $L_{gm}$ is the geometric inductance per unit length of the nanowire, and $C_m$ is the capacitance per unit length of the nanowire. The geometric conductance and capacitance per unit length may be calculated by conventional methods. The kinetic inductance (in Henries/square) of the nanowire sensor 210 may be calculated from the following expression $$L_{km} = \frac{hR_s}{2\pi^2 \Delta \tanh(\Delta/2k_B T_c)} \qquad \text{Eq. (4)}$$

where h is the Planck constant, $R_s$ is the sheet resistance of the normally conducting film of superconducting material from which the nanowire is formed, $k_B$ is the Boltzman constant, $T_c$ is the critical temperature of the superconducting material, and Δ represents the temperature-dependent superconducting energy gap. A value for Δ can be obtained from the following relation $$\Delta = 1.76 k_B T_c \tanh\left(1.74\sqrt{\frac{T_c}{T} - 1}\right) \quad \text{Eq. (5)}$$

in which T represents the operating temperature of the nanowire sensor.

By reducing the width w and thickness $t_c$ of the conductive line 310 in a nanowire sensor, it's kinetic inductance per unit length can become larger than the geometric inductance by more than a factor of 10 and as much as approximately 100 times the geometric inductance. In this regard, the superconducting nanowire can be thought of as an integrated, high-kinetic-inductance delay line. The inventors have recognized and appreciated that a high inductance of a nanowire sensor 210 can be used advantageously in an imaging application. Such a large geometric inductance can reduce the group velocity in the nanowire sensor 210 to a small fraction of the speed of light (e.g., less than one-tenth the speed of light and as low as 1% or less of the speed of light). By slowing the plasma wave pulses down in the nanowire sensor, appreciable differences in arrival times of the first pulse 551 and second pulse 552 may accumulate, even for sub-millimeter lengths of a nanowire sensor. The increased difference in arrival times allows high temporal resolution of the pulse arrivals so that the detection event location and time can be determined with greater accuracy than would be the case for a normal conducting line.

Although the group velocity for a nanowire sensor may be slowed to less than 1% of the speed of light, the inventors have further recognized and appreciated that the reduction in width w increases the characteristic impedance per unit length of a nanowire sensor. A large impedance mismatch between the nanowire sensor 210 and cabling to the RF amplifiers 140 can lead to inefficient coupling of signal to the amplifiers, reflections, and noise. Also, a high total inductance of a nanowire sensor can impose a limit on an event detection rate for the imaging system.

Figure 6:
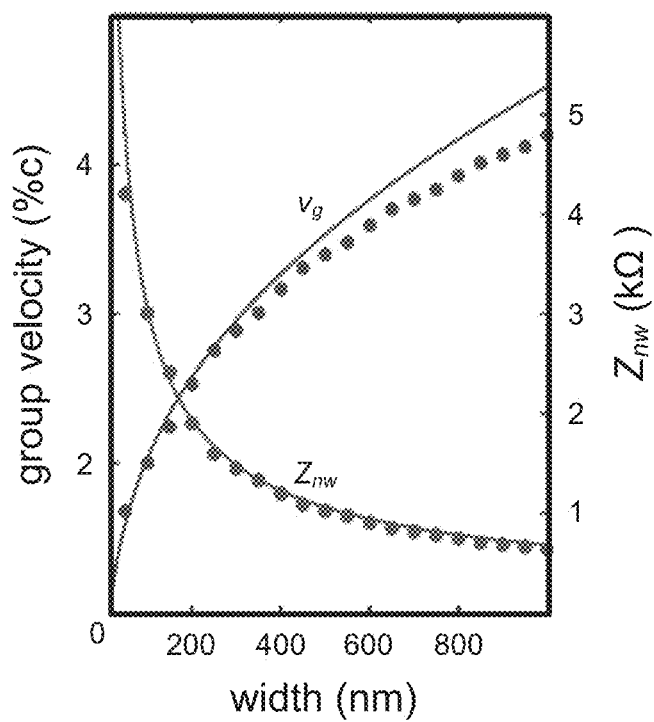
FIG. 6 graphs calculated group velocity $v_g$ and impedance $Z_{nw}$ as a function of width of a nanowire sensor's conductive line associated with a nanowire sensor, according to some embodiments.

Results from analytic and numerical calculations of group velocity $v_g$ in a nanowire sensor and its impedance per unit length $Z_{nw}$ as a function of width w of the conductive line 310 are shown in FIG. 6. The dots are from numerical simulations in which radio-frequency plasma waves were simulated in the superconducting coplanar transmission line structure, and the lines are from analytical calculations. The capacitance and geometric conductance were calculated using conventional methods and considering the metals to be lossless. The kinetic inductance was calculated and added to the geometric inductance before determining the impedance per unit length and group velocity. The calculations were based on the coplanar transmission line structure shown in FIG. 3C and device depicted in FIG. 9. For this structure, as the group velocity falls below 2% of the speed of light c, the impedance per unit length $Z_{nw}$ can increase to several thousand ohms.

According to some embodiments, a nanowire sensor 210 may be constructed to have a group velocity between 1.5% and 3% of the speed of light and an impedance between 700 ohms and 4000 ohms. In some implementations, a parallel-plate transmission line structure may be used to increase the capacitance per unit length of the nanowire sensor, such as depicted in FIG. 3E. Increasing the capacitance per unit length can decrease the impedance per unit length of the nanowire sensor and decrease the group velocity. Additionally or alternatively, high dielectric materials (such as LaAlO$_3$) may be used for the insulating layer 320. Superconducting materials with higher kinetic inductance (such as tungsten silicide) may be used instead of niobium nitrate. In some cases, the impedance of the nanowire sensor may be between 200 ohms and 1000 ohms.

Because most radio-frequency systems are designed for low impedances (e.g. 50 ohms or 75 ohms), impedance mismatches between the nanowire sensor 210 and signal lines in the imaging system 100 may be unavoidable. To avoid large and abrupt impedance mismatches, the impedance-transforming elements 215, 216 (shown in FIG. 2) may be included between the nanowire sensor 210 and external circuitry, as described above. An advantage of a Kopfenstein tapered impedance-transforming element is that it can provide high-pass filtering and impedance matching over a broad radio-frequency bandwidth (e.g., a bandwidth greater than 2 GHz and as large as 10 GHz in some cases). Impedance matching over large bandwidths allows sharp rise times for detection-event pulses and their transmittal with low distortion to the imaging system's signal analyzer 160.

Figure 7:
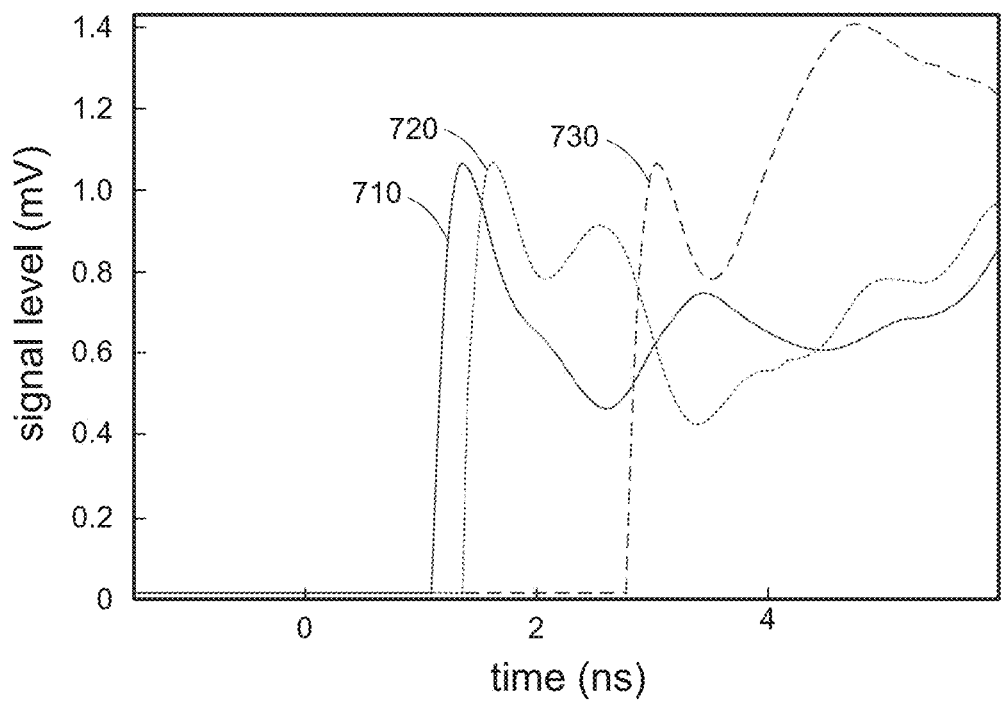
FIG. 7 depicts example pulses recorded from single-photon detection events occurring at three different locations along a nanowire sensor.

FIG. 7 shows example pulses collected from a first detector coupled to a first end of an integrated nanowire sensor 210 that was fabricated from a 7-nm-thick film of NbN. The width of the nanowire was approximately 300 nm. In this embodiment, the nanowire sensor was irradiated with a focused beam of optical pulses (at a wavelength of approximately 1.5 microns) from a femtosecond laser at three locations along the nanowire. An external photodiode (not shown in the drawings) was used to sense output pulses from the laser and provide a reference time (t=0 in the graph of FIG. 7). The nanowire sensor was constructed to have a group velocity of about 2% of the speed of light. The first trace 710 was recorded from the first detector when the focused optical beam was located 1 mm from a first end of the nanowire sensor 210. The second trace 720 was recorded from the first detector when the focused beam was located 3 mm from the first end of the nanowire sensor 210. The third trace 730 was recorded from the first detector when the focused beam was located 14 mm from the first end of the nanowire sensor 210. Because of adequate impedance matching, the received electrical pulses from the nanowire sensor have steep rising edges and the arrival times may be well resolved with a signal analyzer 160 having 10 ps resolution. According to some embodiments, the arrival times may be determined as a time at which the received signal crosses a predetermined threshold value or exceeds a predetermined percentage of the first detected peak value.

The inventors have recognized and appreciated that it may be possible to detect and discriminate against double or multi-detection events, which is sometimes referred to as detecting photon number. Multi-detection events are multiple detection events that occur nearly simultaneously at locations along the nanowire sensor or occur within a time window that would not be resolved by the detection electronics. A multi-detection event can give erroneous imaging data if processed as a single detection event, and it may be beneficial to prevent multi-pulsing data from contributing to images. However, for some applications it is beneficial to know the number of detection events that occur simultaneously or nearly simultaneously.

Figure 8:
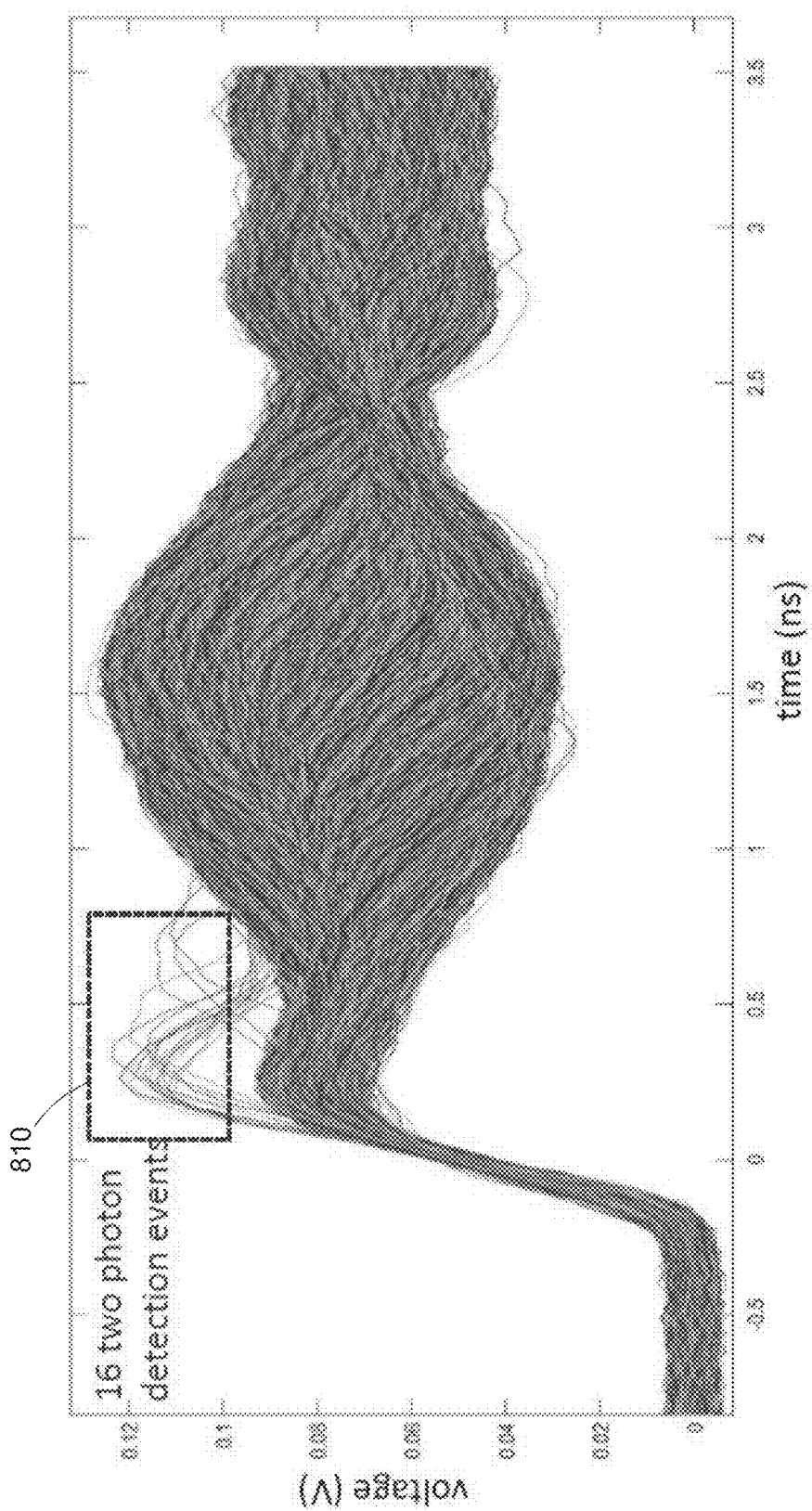
FIG. 8 plots detection-event signals recorded from approximately 50,000 single-photon detection events and shows a few signals resulting from simultaneous detection events along a nanowire sensor.

FIG. 8 is a graph of approximately 50,000 detection-event signals received from a nanowire sensor that was illuminated with low-level light. There are 16 detection-event signals, indicated by the dashed rectangle 810, that exhibit abnormally high first peak values. These 16 detection-event signals are believed to be due to multiple photons (two in these measurements) striking the nanowire sensor nearly simultaneously. In some embodiments, the multi-detection event signals may be discriminated against for imaging purposes by rejecting signals having first peak values greater than a predetermined signal level or greater than a predetermined percentage of the average recorded first peak value.

In operation, signal pulses from each detection event may be received and analyzed to determine a location $x_{de}$ along the nanowire sensor 210 at which the detection event occurred. Additionally, the signal pulses may be analyzed to determine a time $t_{de}$ at which the detection event occurred. The location data may be mapped to a pixelated two-dimensional image (such as one displayed by a liquid-crystal display, for example) which records the number of detection events within predefined pixels of the two-dimensional image. The number of detection events corresponds to intensity of the recorded image. The temporal data may be used to provide time sequences of image formation.

As may be appreciated from the foregoing description of a nanowire sensor, the nanowire sensor acts as both a detector and a delay component, without requiring any multiplexing circuits or clock signals to drive integrating and read-out circuitry for a large plurality of pixels of conventional imaging systems. This can result in a dramatically more compact imaging device that is also suitable for large-scale integration. Based upon results from an example nanowire sensor described below, nanowire sensors may be formed in super-arrays to create a camera with millions of pixels, 10 GHz counting rate, 100 cm² detection area, and single-event-detection sensitivity.

Example Nanowire Sensor

An example nanowire sensor was fabricated and characterized for single-photon imaging applications. The nanowire sensor is shown in two scanning-electron micrographs in FIG. 9 and comprises a double-meandering, coplanar transmission line structure (like that depicted in FIG. 3C) that spans a detection region 202 of approximately 190 microns by 290 microns, indicated by the white, dashed rectangle. The nanowire sensor comprises 15 connected rows, each having a square-wave meander with a pitch p of approximately 5.4 microns and amplitude d of approximately 9.7 microns. The periodicity q between the rows is approximately 13.0 microns. Adjacent to the edges of the detection region 202 in the ±X directions are dose-biasing features 220. At each end, the nanowire sensor connects to Klopfenstein tapered impedance-transforming elements 115, 116, of which only a small portion is shown. The nanowire sensor and impedance-transforming elements 115, 116 are patterned from a single layer of niobium nitride (NbN) film having a thickness of approximately 7 nm. The NbN film is deposited on a layer of silicon dioxide (approximately 300 nm thick) formed on a 4-inch diameter silicon wafer. The critical temperature $T_c$ of the NbN film is 10 K, its sheet resistance $R_s$ is approximately 331 ohms/square, and its residual resistance ratio RRR is approximately 0.8. The kinetic inductance (at an operating temperature of approximately 4.2 K in a liquid-helium-cooled environment) is approximately 49 picoHenries/square. The nanowire sensor, dose-biasing features, and impedance-transforming elements were patterned in resist using an electron-beam lithography tool and then transferred into the NbN film in a $CF_4$ atmosphere using a reactive ion-etcher.

Figure 9:
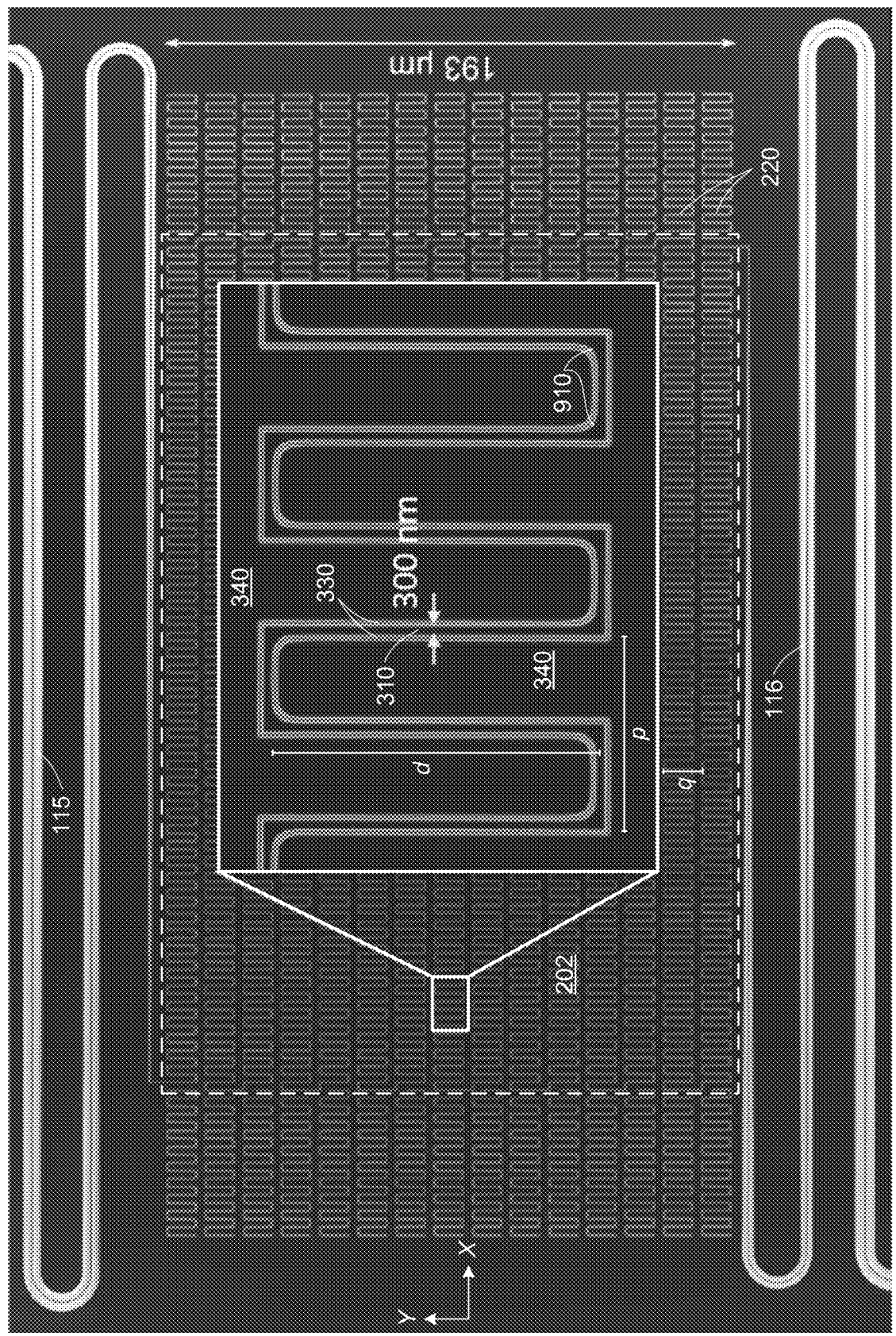
FIG. 9 includes two scanning-electron micrographs showing an example nanowire sensor and portions of impedance-transforming elements in a first micrograph and a magnified view of the nanowire sensor in a second, overlaid micrograph.

The inset in FIG. 9 shows further details of the nanowire sensor. The nanowire sensor comprises a continuous conductive line 310 that runs between reference planes 340. The conductive line and reference planes appear as dark areas in the micrograph. The width of the conductive line 310 is approximately 300 nm in the straight sections of the line and increases at corners. There are gaps 330 (light-colored areas), approximately 100 nm wide, between the conductive line and the reference planes 340. Interior corners 910 of the conductive line 310 are rounded, according to some embodiments, to prevent current crowding in the superconducting conductive line 310. In some implementations, the outer corners may also be rounded. The total length of the meandering nanowire sensor is approximately 19.7 mm, and its impedance is calculated to be approximately 1.4 kΩ.

The Klopfenstein taper connected to each end of the nanowire sensor is designed to have a broad bandwidth pass-band at high-frequency. The pass-band starts at approximately 0.8 GHz and extends to over 2.4 GHz. To achieve this pass-band and provide impedance transformation from approximately 1.4 kΩ at the nanowire sensor to 50Ω RF cabling, each taper has an overall length of 27 mm. The width of the conductive line in each taper smoothly changes from approximately 300 nm at the nanowire sensor to approximately 105 μm at a contact pad, to which a wire bond is used to connect to cabling and external circuitry.

To check performance of the Klopfenstein taper, RF measurements were made using a similar taper to determine its transmission characteristic as a function of frequency. The tested taper comprised a 17-mm-long Klopfenstein taper formed of NbN without a photon-sensitive nanowire connected to its high-impedance end. The taper was designed into a coplanar transmission line structure, like the nanowire sensor, with uniform 3 μm gaps between the reference planes 340 and a conductive signal line having a width that smoothly changed from 88 μm at one end of the taper to 10 μm at the high-impedance end. In order to characterize the taper in a superconducting state without switching it to normal conduction by the input RF signals, the narrowest width of the signal line was 10 μm so that the switching current would be about 0.4 mA, a current level well above that for the applied RF test signals. The RF test signals at different frequencies were applied at the low-impedance end of the impedance-transforming element, while a transmission characteristic $S_{21}$ of the impedance-transforming element was measured.

Figure 10:
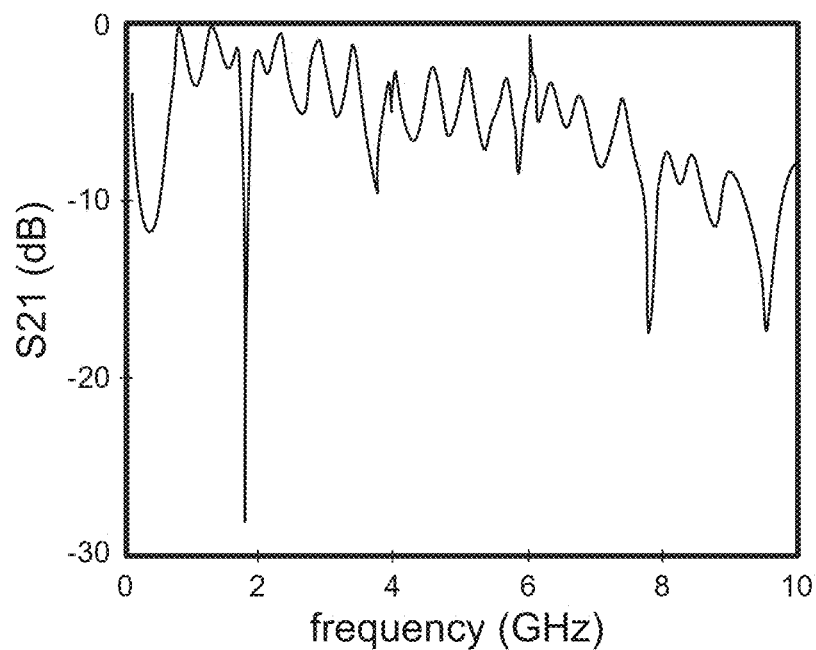
FIG. 10 graphs a transmission coefficient of a Klopfenstein tapered-strip-line impedance-transforming element, according to some embodiments.

The results of the RF measurements are shown in FIG. 10, and show a high-frequency pass-band between about 0.7 GHz and about 2.4 GHz, with attenuation less than about 3 dB. The bandwidth of the taper was measured using a Network analyzer, and the recorded values for $S_{21}$ are $20 \times \log(V_{out}/V_{in})$. The pass-band covers a spectrum that supports transmission of the fast-rising edges of detection-event pulses and enable more accurate reads of pulse-arrival times. The pass-band exhibits a steep dip at 2.4 GHz, which is believed to be due to losses of bonding wires and a printed circuit board (PCB) trace to which the taper was connected. The PCB included a subminiature push-on (SMP) connector which allowed connection to external cabling. These results indicated that the Klopfenstein tapers used for the imaging chip depicted in FIG. 9 would provide detection-event pulses with sufficiently fast rise times.

The spatial resolution of the fabricated nanowire sensor shown in FIG. 9 was dominated by electrical noise in the readout circuits and the speed of signal propagation in the conductive line 310 of the nanowire sensor. Electrical noise contributes to variations in the detected pulse arrival times $t_{d1}$ and $t_{d2}$, referring to FIG. 5C. These variations lead to variations or uncertainty in determining the location $x_{de}$ of the detection events, according to EQ. 1. This uncertainty can be qualified by defining the following Gaussian point-spread function $$b(x) = \exp(-x^2/2h^2)$$ Eq. (6)

where $h=(\delta/\rho) \times v_g/2$. The value $\delta$ was measured as a root-mean-square amplitude of the measurement system's electrical noise for a 20 nanosecond measurement interval and $\rho$ is the slope of the pulses at the discrimination threshold level. The point-spread function can be used to estimate the effective resolution as limited by electrical noise. From the waveform of the output pulses, the ratio $(\delta/\rho)$ was determined to be approximately 3.2 ps. Given this constraint, a slow $v_g$ can help to reduce h so that the original location of a detection event can be determined with less error. For the fabricated nanowire sensor shown in FIG. 9, the group velocity $v_g$ was about 5.6 μm/ps (~2% of the speed of light c). Substituting the values for $v_g$ and $(\delta/\rho)$ into EQ. 6 yields a full-width-half-maximum value Δb for the point-spread function b(x) of approximately 21 microns. The width of b(x) determines a noise-limited spatial resolution for the particular nanowire sensor design and read-out electronics.

Figure 16:
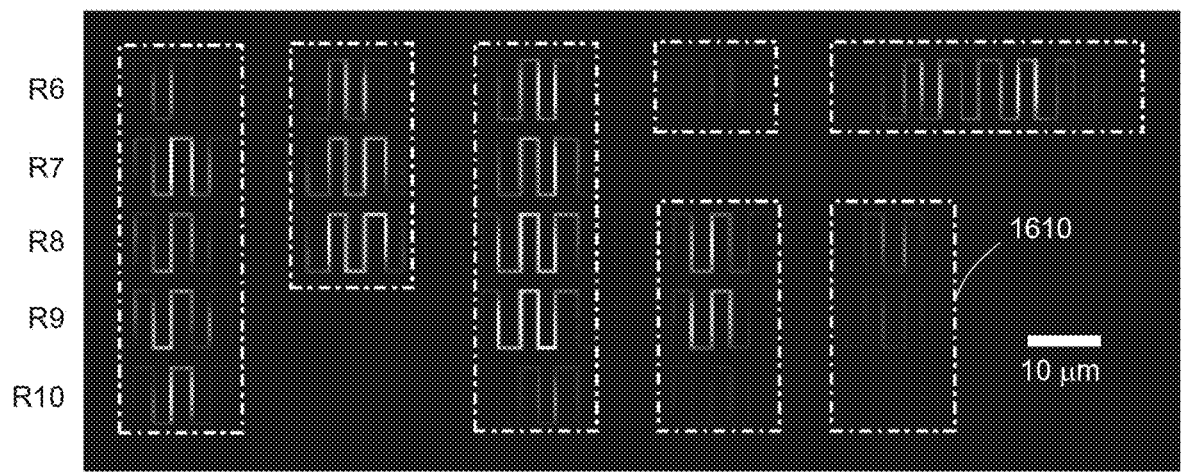
FIG. 16 is an image formed using a nanowire imaging system.

Using the calculated point-spread function b(x), the two-dimension spatial resolution can be calculated by taking into account the meander geometry for the nanowire sensor, from which a one-dimensional distance $x_w$ along the wire is mapped to a two-dimensional location (x, y) on the imaging chip containing the nanowire sensor. For the geometry shown in FIG. 9, the vertical (y-direction) spatial resolution $R_y$ is the spacing between rows q=13.0 μm and the horizontal (x-direction) spatial resolution $R_x$ can be estimated from the following expression $$R_x = \Delta b \frac{p}{l_m}$$ Eq. (7)

where p=5.4 μm is the pitch of one meander period and $l_m$=22.84 μm is the effective length of one meander period in each row. Accordingly, the spatial resolution in the X direction was less than 10 μm. With these spatial resolutions, the nanowire sensor shown in FIG. 9 was used to image letters with a 12.6 μm stroke width and 12.6 μm spacing between strokes. An image reconstructed from single-photon detection events is shown in FIG. 16. Better resolution could be achieved by using read-out electronics with less intrinsic electrical noise or slowing the group velocity $v_g$ even further.

Figure 11:
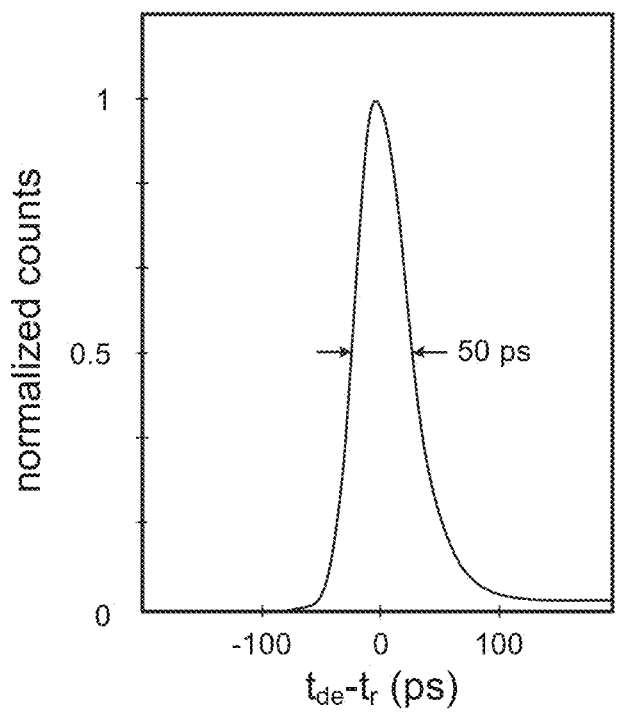
FIG. 11 plots results of timing jitter measurements for a nanowire sensor, according to some embodiments.

Temporal resolution of the nanowire sensor was also evaluated. The time of occurrence of a detection event $t_{de}$ can be determined from EQ. 2 and is independent of the hot-spot location $x_{de}$. The nanowire sensor's temporal resolution can be characterized by a timing jitter $j_{de}$, which may be defined as time variations of the measured detection event times $t_{de}$. The timing jitter $j_{de}$ includes both the electronic jitter from electrical noise and intrinsic jitter from due to the nanowire sensor's detection mechanism. The timing jitter $j_{de}$ was measured for the nanowire sensor shown in FIG. 9 using a mode-locked laser operating at a wavelength of 1.5 μm. The output from the laser was split into two beams. One beam was sent to the nanowire sensor for measuring $t_{de}$ while the other beam was detected by a fast photodiode and fast oscilloscope to determine a timing reference $t_r$ with picosecond resolution. Results from the timing jitter measurements are shown in FIG. 11. The graph shows a histogram of the number of counts (normalized) of detection events as a function of $(t_{de}-t_r)$. The full-width-half-maximum value of this histogram is approximately 50 ps, which indicates a high temporal resolution of the nanowire sensor that exceeds that of TES and MKID imagers and is commensurate with that of SNSPD detectors.

Figure 12:
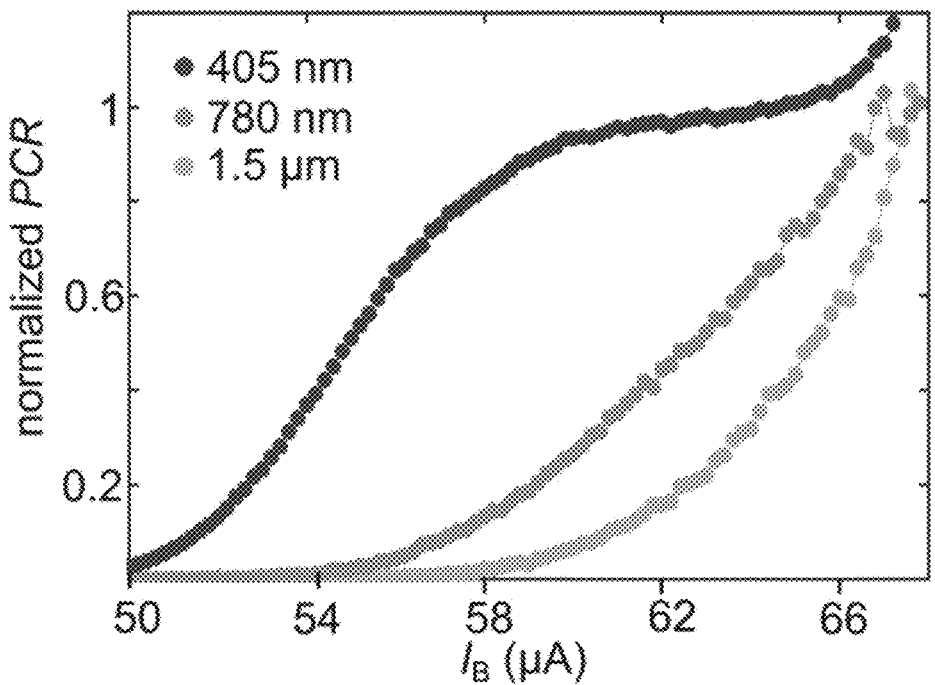
FIG. 12 plots results of normalized pulse count rate (PCR) measurements for a nanowire sensor illuminated with three different wavelengths and operated at different bias currents, according to some embodiments.

The nanowire sensor also exhibited single-event detection over a wide optical bandwidth. FIG. 12 shows photon counts versus bias current $I_b$ that were measured at three illumination wavelengths of 405 nm, 780 nm and 1.5 μm. At 405 nm wavelength, the internal quantum efficiency of the wire saturated, suggesting a near-unity internal quantum efficiency of the nanowire. At longer wavelengths, the quantum efficiency was reduced. Reducing the width of the conductive line, using a microstrip transmission line (as depicted in FIG. 3E) to remove the adjacent insensitive reference planes 340, and/or integrating an optical cavity with the device (which could use the microstrip reference plane 360 as a reflecting mirror, for example) may increase the device efficiency at longer wavelengths. In some embodiments, the reference plane 360 may be spaced from the conductive line 310 by a distance that is approximately equal to an integer number of half optical wavelengths in the insulating layer 320 to form an optical cavity. In some implementations, the reference plane 360 may comprise a layer of gold, which is highly reflective to most optical and infrared wavelengths.

A parallel-plate transmission line, as depicted in FIG. 3E, has additional advantages over the coplanar transmission line structure depicted in FIG. 3C. The reference planes 340 for the coplanar transmission line undesirably occupies significantly larger area than the nanowire's conductive line 310. Accordingly, the reference planes 340 create appreciable "dead space" in which photons may not be detected. The parallel-plate transmission line of FIG. 3E avoids large dead spaces and allows tight packing of the nanowire's conductive line. In some embodiments, two or more nanowire sensors may be interleaved or stacked to share a same detection region 202 (referring to FIG. 2). Interleaving conductive lines from two or more nanowire sensors on a same plane or stacking conductive lines from two or more nanowire sensors on vertical layers can improve detection efficiency and may allow the combined sensors to determine a number of photons incident simultaneously, or nearly simultaneously, on the sensors. Determining a number of photons incident can be useful for linear optics quantum computing, conditional state preparation, source characterization for enhanced quantum-key-distribution security, high-sensitivity optical communication, laser radar, and fluorescence measurement techniques.

Although the parallel-plate transmission line, as depicted in FIG. 3E, allows a higher density of conductive lines 310, the inventors have recognized and appreciated that a trade-off exists between sensor efficiency and signal loss when the density (or filling factor) of conductive lines is varied. For a 100-nm-wide conductive line 310, the peak optical absorption at approximately 1550 nm wavelength can increase to about 97% for approximately 100 nm spacing between the conductive lines. However, with this high density, propagation losses (due to crosstalk between adjacent lines) in the conductive line can increase to about 0.25 dB/micron. According to some embodiments, an average spacing between conductive lines may be set between 200 nm and 5 microns to avoid high propagation losses. In some cases, the average spacing between conductive lines may be set between 200 nm and 800 nm to avoid high propagation losses and have greater than 50% optical absorbance. An average spacing may be determined by measuring distances between two adjacent lines for each unit of line length and averaging the measured distances. The unit of line length may be 10 microns, according to some embodiments.

Figure 13:
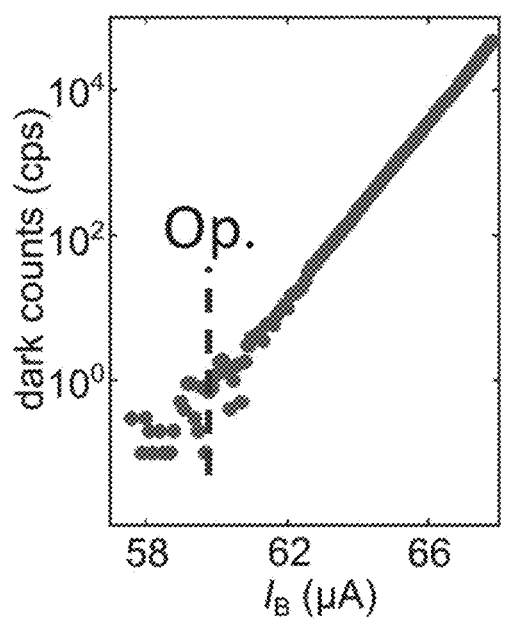
FIG. 13 plots measured dark count rates for a nanowire imaging sensor as a function of bias current, according to some embodiments.

As described above, it is desirable for a single-event detector to have low dark count rates so that detector noise does not overwhelm an actual signal detected by the sensor. The nanowire sensor's dark count rates were measured as a function of bias current for the device shown in FIG. 9, and the results are shown in FIG. 13. For these measurements, the nanowire sensor was operated in a dark environment shielded from optical radiation. The results in FIG. 13 show that the dark count rates increase exponentially with bias current. When the nanowire sensor is operated at a bias current of approximately 60 the dark count rate can be at or below 1 count per second.

The dark counts were spatially mapped to the nanowire sensor, and it was observed that the dark counts came from distinct locations along the nanowire, each having a measureable histogram and corresponding full-width-half-maximum (FWHM) value. In imaging applications, the dark counts may be subtracted from single-event detection data to improve image quality. The FWHM values were averaged for the ten most prominent dark-count histograms, which accounted for 74% of the total dark counts and approximately 2% of the length of the nanowire sensor. The average FWHM value corresponded to an uncertainty in the location of the dark-count source of approximately 30 microns.

The widths of the dark-count histograms were slightly larger than the spatial resolution calculated from the point-spread function b(w), which suggests a possible intrinsic length of dark-count sources, or perhaps an underestimate of the system's electrical noise. Regardless, the number of resolvable locations in the nanowire sensor may be estimated using the FWHM value of the point-spread function or average FWHM value from the dark-count histograms. Using the 30 micron value, the maximum resolvable number of pixels Np for the nanowire sensor shown in FIG. 9 is approximately $L_e/30 = 590$, where an effective length $L_e$ (17.635 mm) is the effective length of a straight nanowire sensor converted from the double-meandered geometry and taking into account an increase in signal velocity at corners of the meandered nanowire sensor. Accordingly, the estimated pixel density for the nanowire sensor shown in FIG. 9 is approximately 106 pixels/cm$^2$.

Figure 14:
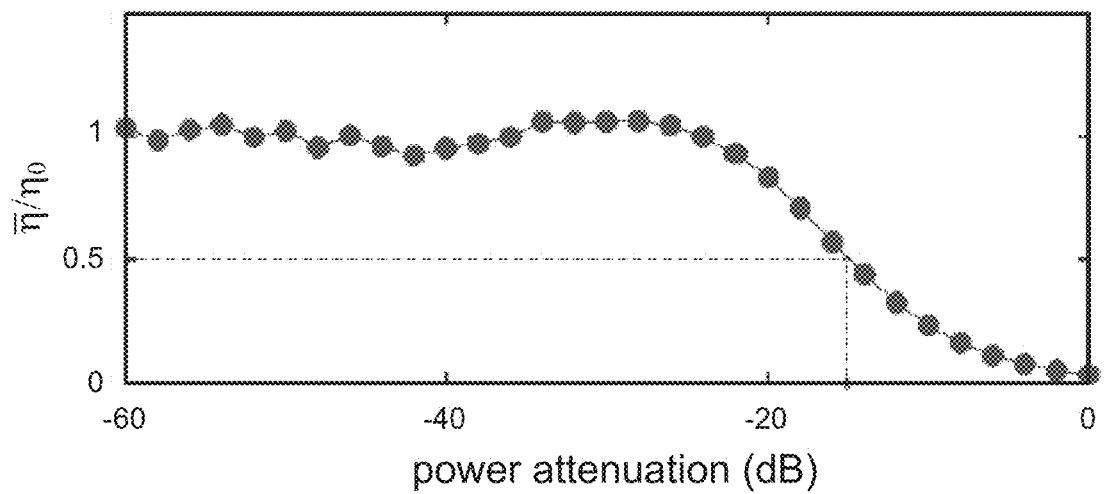
FIG. 14 plots average detection efficiency per second normalized to the detection efficiency for a single photon as a function of infrared photon flux on a nanowire sensor, according to some embodiments.
Figure 15:
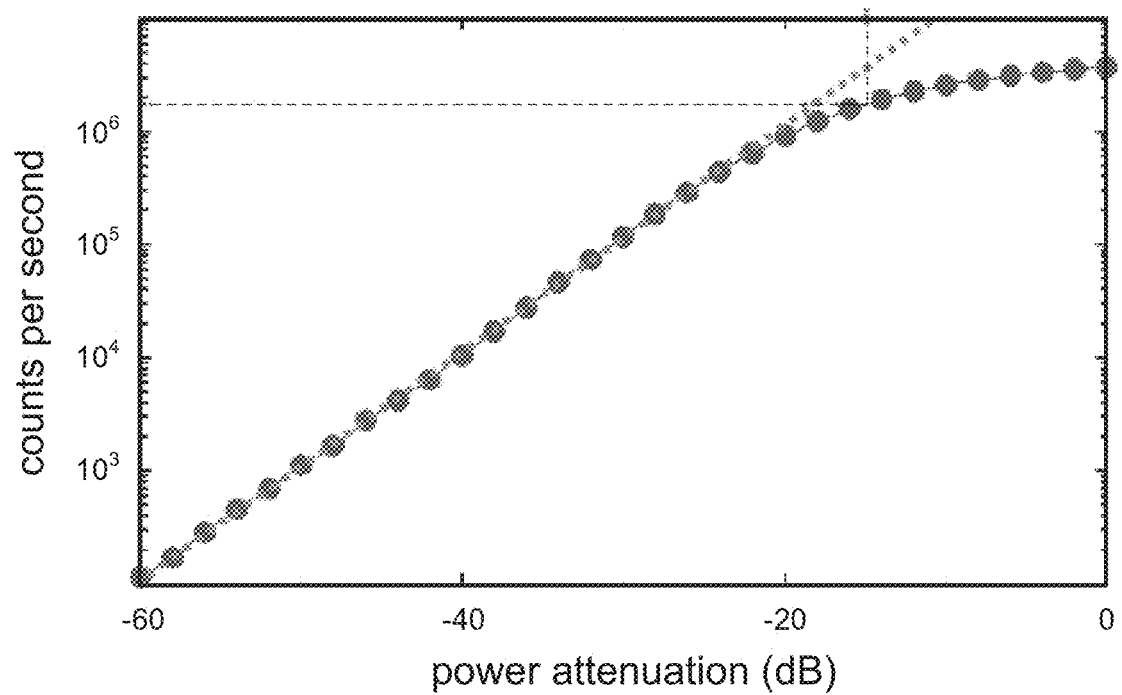
FIG. 15 illustrates records count rates for the same nanowire sensor and illumination conditions as FIG. 14, and indicates that imaging at count rates as high as $10^6$ per second is possible.

The imaging time for a nanowire sensor is limited by a maximum counting rate of the sensor and the acquisition speed of the readout electronics. To investigate the ultimate speed of an imaging system that uses a nanowire sensor like that shown in FIG. 9, the counting rate can be measured as a function of flux of detection events. A maximum counting rate ($CR_{max}$) may be defined as the count rate at which the average detection efficiency drops to one-half the value at a low count rate. FIG. 14 plots the average detection efficiency per second normalized to the detection efficiency for detecting a single photon at different attenuations of incident illumination. FIG. 15 plots the recorded counts per second for the same attenuations of the incident illumination. The linear part of FIG. 15 can be used to find the detection efficiency for detecting a single photon, where the inter arrival time of individual photons is longer than the current recovery time in the nanowire sensor. The graphs in FIG. 14 and FIG. 15 indicate that detection events may be recorded at rates as high as 1 million per second. Higher rates may be achieved by lowering the kinetic inductance of the nanowire sensor at a cost of spatial and temporal resolution.

The structure shown in FIG. 9 was used to record a micro-scale image of lettering patterned in an optical mask that was placed over the detection region 202 and illuminated with a low-intensity source. The mask was suspended 200 microns above the nanowire sensor. The lettering included an "MIT" logo that is indicated by the dot-dashed rectangles 1610 in FIG. 16. The logo was repeated across the optical mask and recorded multiple times across the full detection region 202. Only a portion of the image is shown in FIG. 16. The image was formed by accumulating data from a plurality of single-photon detection events. Further details of the imaging process are described in an article titled "Single-Photon Imager Based on Microwave Plasmonic Superconducting Nanowires," coauthored by the inventors and available on-line at https://arxiv.org/abs/1605.08693, the contents of which are incorporated herein by reference.

For imaging, a 6 GHz oscilloscope (Lecroy Wavepro 760Zi, available from Teledyne LeCroy of Chestnut Ridge, N.Y.) was used to receive detection-event signals from the amplifiers 140 (referring to FIG. 1). The oscilloscope was triggered by one of the signal channels. The arrival times measured by the oscilloscope were recorded in the oscilloscope and then exported for image post processing. The bias Ts 130 were model ZFBT-6GW+, available from Mini-Circuits of Brooklyn, N.Y. Each bias Ts RF ports were connected to two RF amplifiers in series (model LNA-2500, available from RF Bay, Inc. of Gaithersburg, Md., in series with model ZX60-3018G-S, available from Mini-Circuits of Brooklyn, N.Y.). The cascaded amplifiers provided a total gain of 47 dB and a pass-band from approximately 20 MHz to approximately 2.5 GHz.

An imaging algorithm was developed for the nanowire sensor. Raw imaging data is derived from a sensor histogram of differential time $\Delta t = t_{d2} - t_{d1}$ of photon counts acquired by an oscilloscope connected to read-out amplifiers 140 (referring to FIG. 1). The times Δt were corrected for fixed cabling and electronic delays between the nanowire sensor and read-out oscilloscope. According to some embodiments, the imaging algorithm maps a photon count $C_n$ at each time bin $\Delta t_n$ of the sensor histogram to an intensity value $I_n$ at a corresponding two-dimensional location $(X_n, Y_n)$ of the imaging chip. First, the effective one-dimensional distance $x_w$ along the nanowire sensor may be calculated from the layout of the double-meandered nanowire, taking into account the effective length of the corners. A corner's effective length was determined to be 0.68 of its physical length based on numerical simulation of the propagation time through a corner for the structure shown in FIG. 9. In some cases, a look-up table may be used to map $x_w$ to $(X_n, Y_n)$. In some cases, the sensor histogram data can be interpolated with a finer time step (e.g., 0.045 ps) than the initial width of time bins into which detection events are binned, and then the interpolated time bins may be converted to positions $x_w$ and to $(X_n, Y_n)$. The final image may then be constructed by assigning intensity values proportional to event-detection counts to a two-dimensional grid of pixels corresponding to the $(X_n, Y_n)$ positions of the chip and displaying the pixels on a screen. The image shown in FIG. 16 was generated using such an algorithm on data collected by the nanowire sensor shown in FIG. 9.

Figure 17:
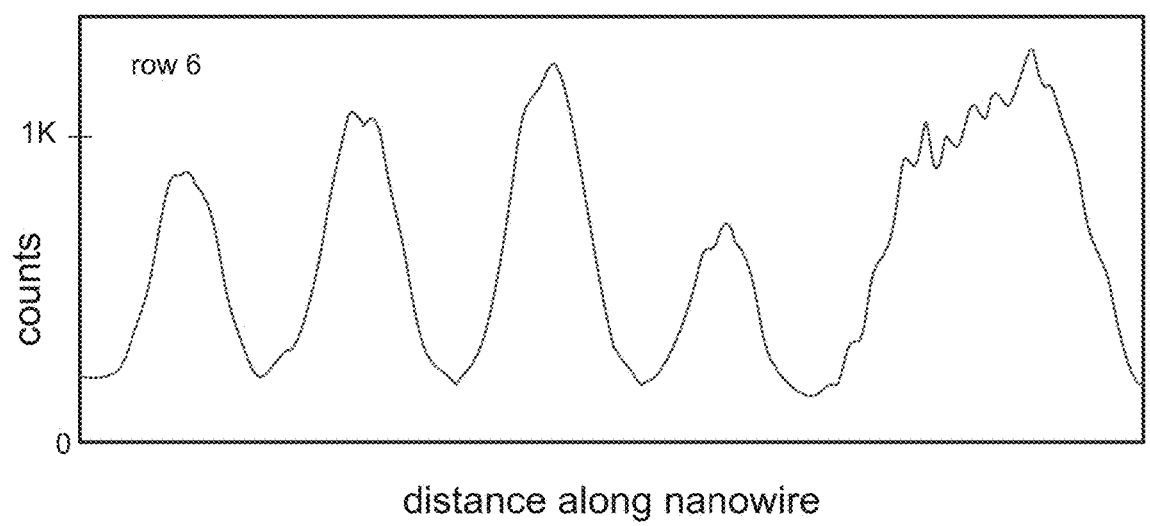
FIG. 17 is a histogram of detection events recorded for the portion of row 6 (R6) used to form the corresponding image in FIG. 16.

An example histogram generated from detection events occurring along a nanowire sensor is shown in FIG. 17. The histogram corresponds to a portion of row 6 (R6) of the nanowire sensor that was used to form the image in FIG. 16. The counts from the histogram are mapped to $(X_n, Y_n)$ positions of the chip to form the image.

Additional or alternative imaging processes may be used in some embodiments. For example, two-dimensional Gaussian point-spread functions representative of the spatial uncertainty of detection events for the nanowire sensor may be mapped to a final image grid. To reduce the mapping time, the photon count $C_n$ may be spread along the meandered nanowire in the two-dimensional image, where the photon counts are distributed according to a Gaussian weight function with a standard deviation of 5 for example. During the mapping process, the $\Delta t_n$ may be shifted with a constant time to correct for the difference of the delays from electrical connections to the two ends of the wire, and the group velocity $v_g$ may be adjusted to improve image quality. The adjustment to group velocity may be evaluated by checking alignment of neighboring rows of the nanowire sensor.

Conclusion

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, system upgrade, and/or method described herein. In addition, any combination of two or more such features, systems, and/or methods, if such features, systems, system upgrade, and/or methods are not mutually inconsistent, is included within the inventive scope of the present disclosure.

The terms "about," "approximately," and "substantially" may be used to refer to a value, and are intended to encompass the referenced value plus and minus variations that would be insubstantial. The amount of variation could be less than 5% in some embodiments, less than 10% in some embodiments, and yet less than 20% in some embodiments. In embodiments where an apparatus may function properly over a large range of values, e.g., one or more orders of magnitude, the amount of variation could be as much as a factor of two. For example, if an apparatus functions properly for a value ranging from 20 to 350, "approximately 80" may encompass values between 40 and 160.

The phrase "and/or," as used in the specification and in the claims, should be understood to mean "either or both" of the elements so conjoined, i.e., elements that are conjunctively present in some cases and disjunctively present in other cases. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The claims should not be read as limited to the described order or elements unless stated to that effect. It should be understood that various changes in form and detail may be made by one of ordinary skill in the art without departing from the spirit and scope of the appended claims. All embodiments that come within the spirit and scope of the following claims and equivalents thereto are claimed.

What is claimed is:

1. An imaging device comprising:
a substrate;
an image-detection region located on the substrate; and
a conductive line patterned in the image-detection region and formed from a superconducting material, wherein the conductive line is configured to provide a first signal from a first end of the conductive line and a second signal from a second end of the conductive line in response to sensing a detection event, and wherein the first signal and second signal indicate a location of the detection event along the conductive line, wherein a group velocity for the first signal in the conductive line when the superconducting material is in a superconducting state is less than one-tenth the speed of light.

2. The imaging device of claim 1, wherein the first signal and second signal further indicate a time of occurrence of the detection event.

3. The imaging device of claim 1, further comprising a first impedance-transforming element connected to the first end of the conductive line.

4. The imaging device of claim 3, wherein the first impedance-transforming element comprises a Klopfenstein taper.

5. The imaging device of claim 3, wherein the first impedance-transforming element comprises a lumped element network.

6. The imaging device of claim 3, wherein the conductive line and at least a portion of the first impedance-transforming element are formed from a same material deposited in a same deposition step during fabrication.

7. The imaging device of claim 3, further comprising a second impedance-transforming element connected to the second end of the conductive line.

8. The imaging device of claim 1, further comprising:
a second conductive line patterned in the image-detection region and formed from a superconducting material, wherein the second conductive line is configured to provide a third signal from a first end of the second conductive line and a fourth signal from a second end of the second conductive line in response to sensing a second detection event, and wherein the third signal and fourth signal indicate a location of the second detection event along the second conductive line.

9. The imaging device of claim 1, wherein the conductive line is formed as part of a transmission line.

10. The imaging device of claim 1, wherein the conductive line is formed as part of a microwave coplanar transmission line.

11. The imaging device of claim 1, wherein the conductive line is formed as part of a microwave parallel-plate transmission line.

12. The imaging device of claim 1, wherein a width of the conductive line is between 50 nanometers and 1 micron.

13. The imaging device of claim 1, wherein a thickness of the conductive line is less than the London penetration depth for the superconducting material.

14. The imaging device of claim 1, wherein the conductive line is arranged in a double-meander pattern across the image-detection region.

15. The imaging device of claim 14, wherein the double-meander pattern includes a plurality of rows.

16. The imaging device of claim 15, wherein the rows are interleaved.

17. The imaging device of claim 1, further comprising one or more reference planes formed adjacent to the conductive line.

18. The imaging device of claim 1, further comprising an optical cavity formed adjacent to the conductive line.

19. The imaging device of claim 1, further comprising dose-biasing features located adjacent to the image-detection region.

20. The imaging device of claim 1, further comprising a first amplifier connected to the first end of the conductive line, wherein an input impedance of the first amplifier matches an impedance at the first end of the conductive line.

21. An imaging system comprising:
an imaging chip having a substrate, an image-detection region located on the substrate, and a conductive line patterned in the image-detection region and formed from a superconducting material, wherein the conductive line is configured to provide a first signal from a first end of the conductive line and a second signal from a second end of the conductive line in response to sensing a detection event, and wherein the first signal and second signal indicate a location of the detection event along the conductive line;
a first amplifier arranged to receive the first signal from the first end of the conductive line;
a second amplifier arranged to receive the second signal from the second end of the conductive line; and
a signal analyzer arranged to receive an amplified first signal from the first amplifier and an amplified second signal from the second amplifier and configured to process the first amplified signal and the second signal amplified signal to determine a spatial location of the detection event.

22. The imaging system of claim 21, wherein the signal analyzer is further configured to determine a time of occurrence of the detection event.

23. The imaging device of claim 21, wherein a group velocity for the first signal in the conductive line when the superconducting material is in a superconducting state is less than one-tenth the speed of light.

24. An imaging device comprising:
a substrate;
an image-detection region located on the substrate; and
a conductive line patterned in the image-detection region and formed from a superconducting material, wherein the conductive line is configured to provide a first signal from a first end of the conductive line and a second signal from a second end of the conductive line in response to sensing a detection event, and wherein the first signal and second signal indicate a location of the detection event along the conductive line, wherein the conductive line is formed as part of a microwave coplanar transmission line.

25. The imaging device of claim 24, wherein a thickness of the conductive line is less than the London penetration depth for the superconducting material.

26. The imaging device of claim 24, further comprising a first impedance-transforming element connected to the first end of the conductive line.

27. The imaging device of claim 24, further comprising dose-biasing features located adjacent to the image-detection region.

* * * * *